(12) United States Patent
Fujii et al.

(10) Patent No.: US 8,413,507 B2
(45) Date of Patent: Apr. 9, 2013

(54) SEMICONDUCTOR DYNAMIC QUANTITY SENSOR AND METHOD OF MANUFACTURING THE SAME

(75) Inventors: Tetsuo Fujii, Toyohashi (JP); Hisanori Yokura, Obu (JP); Hirofumi Higuchi, Okazaki (JP)

(73) Assignee: DENSO CORPORATION, Kariya (JP)

( * ) Notice: Subject to any disclaimer, the term of this patent is extended or adjusted under 35 U.S.C. 154(b) by 236 days.

(21) Appl. No.: 12/801,405

(22) Filed: Jun. 8, 2010

(65) Prior Publication Data
US 2010/0307246 A1 Dec. 9, 2010

(30) Foreign Application Priority Data

Jun. 9, 2009 (JP) ................................ 2009-138494

(51) Int. Cl.
*G01C 19/56* (2006.01)
*G01P 15/125* (2006.01)
(52) U.S. Cl. .................................. 73/504.12; 73/514.32
(58) Field of Classification Search ............... 73/514.32, 73/514.36, 514.38, 514.29, 504.12, 504.14, 73/504.04, 504.16
See application file for complete search history.

(56) References Cited

U.S. PATENT DOCUMENTS

| 5,198,390 | A | | 3/1993 | MacDonald et al. |
| 5,549,785 | A | * | 8/1996 | Sakai et al. ....................... 438/52 |
| 5,605,598 | A | * | 2/1997 | Greiff ............................... 438/50 |
| 5,824,608 | A | | 10/1998 | Gotoh et al. |
| 5,847,454 | A | | 12/1998 | Shaw et al. |
| 6,065,341 | A | | 5/2000 | Ishio et al. |
| 6,153,917 | A | * | 11/2000 | Matsunaga et al. ........... 257/419 |
| 6,250,165 | B1 | | 6/2001 | Sakai et al. |
| 7,094,622 | B1 | * | 8/2006 | Cui et al. ......................... 438/57 |
| 7,361,524 | B2 | * | 4/2008 | Kang ............................... 438/53 |

FOREIGN PATENT DOCUMENTS

| JP | A-62-266876 | 11/1987 |
| JP | A-H04-240776 | 8/1992 |
| JP | A-04-286165 | 10/1992 |
| JP | A-06-213924 | 8/1994 |
| JP | A-06-347474 | 12/1994 |

(Continued)

OTHER PUBLICATIONS

Office Action mailed May 29, 2012 in corresponding JP Application No. 2010-121888 (and English translation).

(Continued)

*Primary Examiner* — Helen C. Kwok
(74) *Attorney, Agent, or Firm* — Posz Law Group, PLC

(57) ABSTRACT

A semiconductor dynamic quantity sensor has a substrate including a semiconductor substrate, an insulation layer on a main surface of the semiconductor substrate, and a semiconductor layer on the insulation layer. The main surface has a projection that is trapezoidal or triangular in cross section. The semiconductor layer is divided by a through hole into a movable portion. A tip of the projection is located directly below the movable portion and spaced from the movable portion by a predetermined distance in a thickness direction of the substrate. A width of the tip of the projection is less than a width of the movable portion in a planar direction of the substrate. The distance between the tip of the projection and the movable portion is equal to a thickness of the insulation layer.

13 Claims, 14 Drawing Sheets

FOREIGN PATENT DOCUMENTS

| | | |
|---|---|---|
| JP | A-08-219795 | 8/1996 |
| JP | A-09-105760 | 4/1997 |
| JP | A-H11-248733 | 9/1999 |
| JP | A-2001-091262 | 4/2001 |
| JP | A-2008-008672 | 1/2008 |
| JP | A-2008-264902 | 11/2008 |

OTHER PUBLICATIONS

Office Action mailed Jan. 15, 2013 in corresponding JP Application No. 2010-121888 (and English translation).

* cited by examiner

SEMICONDUCTOR DYNAMIC QUANTITY SENSOR AND METHOD OF MANUFACTURING THE SAME

CROSS REFERENCE TO RELATED APPLICATION

This application is based on and incorporates herein by reference Japanese Patent Application No. 2009-138494 filed on Jun. 9, 2009.

FIELD OF THE INVENTION

The present invention relates to a semiconductor dynamic quantity sensor having a movable portion formed in a semiconductor layer that is located on a semiconductor substrate through an insulation layer. The movable portion is displaced in a predetermined direction according to an applied dynamic quantity. The present invention also relates to a method of manufacturing the semiconductor dynamic quantity sensor.

BACKGROUND OF THE INVENTION

There has been proposed a semiconductor dynamic quantity sensor having a movable portion that is displaced in a predetermined direction according to an applied dynamic quantity. In the semiconductor dynamic quantity sensor, a semiconductor layer is located on a semiconductor substrate through an insulation layer. A trench reaching the insulation layer is formed in the semiconductor layer to form the movable portion. The insulation layer directly below the movable portion is removed through the trench so that the movable portion can be movable.

In semiconductor dynamic quantity sensors disclosed in JP-2008-264902 and U.S. Pat. No. 6,065,341 corresponding to JP-11-230986, a projection is formed directly below the movable portion. The projection serves to prevent the movable portion from sticking to the semiconductor substrate, and also serves as a stopper for limiting movement of the movable in a thickness direction of the semiconductor substrate upon application of an excessive external force.

In JP-2008-264902, a top layer (i.e., semiconductor layer) of a silicon on insulator (SOI) substrate is divided by a trench into multiple portions including a movable portion. A middle layer (i.e., insulation layer) of the SOI substrate is etched through the trench to form a projection directly below the movable portion. The projection projects toward the movable portion and is spaced from the movable portion by a predetermined distance in a thickness direction of the substrate.

In U.S. Pat. No. 6,065,341, an electrode pattern (i.e., lower wiring portion) is formed on a substrate (i.e., semiconductor substrate) and electrically connected to a movable portion through a first anchor. The electrode pattern partially projects directly below the movable portion. The projecting portion and a silicon nitride layer on the electrode pattern form a projection.

In JP-2008-264902, the insulation layer is etched through the trench in the semiconductor layer so that the insulation layer can have the projection. Therefore, manufacturing variation in the distance between the projection and the movable portion is likely to occur.

In U.S. Pat. No. 6,065,341, after the movable portion is formed in a monocrystalline silicon substrate (i.e., semiconductor layer) by forming the trench, an etching of a silicon oxide layer is performed through the trench by using the silicon nitride layer as a stopper. Thus, the silicon oxide layer directly below the movable portion is removed so that the movable portion can be movable. This approach may reduce manufacturing variation in the distance between the projection and the movable portion.

In U.S. Pat. No. 6,065,341, the electrode pattern is formed as follows. After a recess is formed in a silicon oxide layer on the semiconductor layer, a silicon nitride layer as a etching stopper and a polysilicon thin layer are deposited. Then, the polysilicon thin layer is doped with impurities and patterned into the electrode pattern.

That is, the method of U.S. Pat. No. 6,065,341 requires a process of forming the recess in addition to a process of pattering the electrode pattern. Further, after the electrode pattern is formed, a silicon oxide layer, a silicon nitride layer, and a polysilicon thin layer are formed to cover the electrode pattern. Then, another monocrystalline silicon substrate is bonded to a surface of the polysilicon thin layer. Then, the semiconductor layer is polished to a predetermined thickness. In this way, complex processes are performed to form the projection before forming the trench in the semiconductor layer. Accordingly, manufacturing cost may be increased.

U.S. Pat. No. 6,065,341 discloses a capacitive acceleration sensor as a semiconductor dynamic quantity sensor. For example, one movable electrode (i.e., beam) is provided with multiple projections, and the width of the projection is less than the width of the movable electrode. Since the width of the movable electrode is of the order of micrometers, it is difficult to accurately form the projection directly below the movable portion. Accordingly, manufacturing cost may be increased or manufacturing variation in a position of the projection with respect to the movable portion may be likely to occur.

SUMMARY OF THE INVENTION

In view of the above, it is an object of the present invention to provide a semiconductor dynamic quantity sensor in which a projection is accurately positioned with respect to a movable portion. It is another object of the present invention to provide a method of manufacturing the semiconductor dynamic quantity sensor.

According to a first aspect of the present invention, a method of manufacturing a semiconductor dynamic quantity sensor includes preparing a substrate having a monocrystalline silicon semiconductor substrate, an insulation layer on a main surface of the semiconductor substrate, and, a P-type silicon semiconductor layer on a surface of the insulation layer. The main surface is different from a (111) plane. The semiconductor layer has a higher impurity concentration than the semiconductor substrate. The method further includes performing an anisotropic etching of the semiconductor layer to form a trench that reaches the surface of the insulation layer and divides the semiconductor layer into a movable portion. The method further includes performing a first selective etching of the insulation layer through the trench to elongate the trench to the main surface of the semiconductor substrate and to cause a width of the insulation layer directly below the movable portion to be less than a width of the movable portion in a planar direction of the substrate. The planar direction is perpendicular to a thickness direction of the substrate. The method further includes performing a selective etching of the semiconductor substrate through the elongated trench by using an alkaline etching solution to form a projection on the main surface of the semiconductor substrate. The projection has a tip in contact with the insulation layer directly below the movable portion. The method further includes performing a second selective etching of the insulation layer after the selective etching of the semiconductor substrate to remove the insulation layer directly below the movable portion so that the movable portion moves upon application of a dynamic quantity.

According to a second aspect of the present invention, a method of manufacturing a semiconductor dynamic quantity sensor includes preparing a substrate having a monocrystalline silicon semiconductor substrate, an insulation layer on a main surface of the semiconductor substrate, and a P-type silicon semiconductor layer on a surface of the insulation layer. The semiconductor layer has a higher impurity concentration than the semiconductor substrate. The method further includes performing an anisotropic etching of the substrate in a thickness direction of the substrate to form a trench that reaches a predetermined depth of the semiconductor substrate by penetrating the silicon layer and the insulation layer and divides the semiconductor layer into a movable portion. The method further includes performing a selective etching of the semiconductor substrate through the trench by using an alkaline etching solution to form a projection on the main surface of the semiconductor substrate. The projection is trapezoidal or triangular in cross section and has a tip in contact with the insulation layer directly below the movable portion. The method further includes performing a selective etching of the insulation layer after the selective etching of the semiconductor substrate to remove the insulation layer directly below the movable portion so that the movable portion moves upon application of a dynamic quantity.

According to a third aspect of the present invention, a semiconductor dynamic quantity sensor includes a substrate having a thickness direction and a planar direction perpendicular to the thickness direction. The substrate includes a monocrystalline silicon semiconductor substrate, an insulation layer, and a silicon semiconductor layer. The semiconductor substrate has a main surface including a recess and a projection adjacent to the recess. The projection is trapezoidal or triangular in cross section. The insulation layer is located on the main surface of the semiconductor substrate and defines a first through hole that extends in the thickness direction and communicates the recess of the semiconductor substrate. The semiconductor layer is located on a surface of the insulation layer and defines a second through hole that extending in the thickness direction. The second through hole communicates with the first through hole and divides the semiconductor layer into a movable portion that is configured to move upon application of a dynamic quantity. A tip of the projection of the semiconductor substrate is located directly below the movable portion and spaced from the movable portion by a predetermined distance in the thickness direction. A width of the tip of the projection is less than a width of the movable portion in the planar direction. The distance between the tip of the projection and the movable portion is equal to a thickness of the insulation layer.

According to a fourth aspect of the present invention, a method of manufacturing a semiconductor dynamic quantity sensor includes preparing a substrate having a monocrystalline silicon semiconductor substrate, an insulation layer on a main surface of the semiconductor substrate, and a N-type silicon semiconductor layer on a surface of the insulation layer. The main surface is different from a (111) plane. The method further includes performing an anisotropic etching of the semiconductor layer to form a trench that reaches the surface of the insulation layer and divides the semiconductor layer into a movable portion. The method further includes performing a first selective etching of the insulation layer through the trench to elongate the trench to the main surface of the semiconductor substrate and to cause a width of the insulation layer directly below the movable portion to be less than a width of the movable portion in a planar direction of the substrate. The planar direction is perpendicular to a thickness direction of the substrate. The method further includes performing a selective etching of the semiconductor substrate through the elongated trench by using an alkaline etching solution to form a projection on the main surface of the semiconductor substrate. The projection has a tip in contact with the insulation layer directly below the movable portion. The method further includes performing a second selective etching of the insulation layer after the selective etching of the semiconductor substrate to remove the insulation layer directly below the movable portion so that the movable portion moves upon application of a dynamic quantity.

According to a fifth aspect of the present invention, a method of manufacturing a semiconductor dynamic quantity sensor includes preparing a substrate having a monocrystalline silicon semiconductor substrate, an insulation layer on a main surface of the semiconductor substrate, and a N-type silicon semiconductor layer on a surface of the insulation layer. The method further includes performing an anisotropic etching of the substrate in a thickness direction of the substrate to form a trench that reaches a predetermined depth of the semiconductor substrate by penetrating the silicon layer and the insulation layer and divides the semiconductor layer into a movable portion. The method further includes performing a selective etching of the semiconductor substrate, with a positive voltage applied to the semiconductor layer, through the trench by using an alkaline etching solution to form a projection on the main surface of the semiconductor substrate. The projection is trapezoidal or triangular in cross section and has a tip in contact with the insulation layer directly below the movable portion. The method further includes performing a selective etching of the insulation layer after the selective etching of the semiconductor substrate to remove the insulation layer directly below the movable portion so that the movable portion moves upon application of a dynamic quantity.

According to a sixth aspect of the present invention, a semiconductor dynamic quantity sensor includes a substrate having a thickness direction and a planar direction perpendicular to the thickness direction. The substrate includes a monocrystalline silicon semiconductor substrate, an insulation layer, and a N-type silicon semiconductor layer. The semiconductor substrate has a main surface including a recess and a projection adjacent to the recess. The projection is trapezoidal or triangular in cross section. The insulation layer is located on the main surface of the semiconductor substrate and defines a first through hole that extends in the thickness direction and communicates with the recess of the semiconductor substrate. The semiconductor layer is located on a surface of the insulation layer and defines a second through hole extending in the thickness direction. The second through hole communicates with the first through hole and divides the semiconductor layer into a movable portion, that is configured to move upon application of a dynamic quantity. A tip of the projection of the semiconductor substrate is located directly below the movable portion and spaced from the movable portion by a predetermined distance in the thickness direction. A width of the tip of the projection is less than a width of the movable portion in the planar direction. The distance between the tip of the projection and the movable portion is equal to a thickness of the insulation layer.

According to a seventh aspect of the present invention, a method of a method of manufacturing a semiconductor dynamic quantity sensor includes preparing a semiconductor substrate having a thickness direction and a planar direction perpendicular to the thickness direction. The method further includes forming a first insulation layer on a surface of the semiconductor substrate. The method further includes forming a conductive layer on the first insulation layer. The method further includes patterning the conductive layer to form a lower wiring portion and a projection. The lower wiring portion and the projection are located in different positions in the planar direction of the semiconductor substrate. The method further includes forming a second insulation layer on the conductive layer to cover the projection. The method further includes forming a semiconductor layer on the second insulation layer. The method further includes performing an anisotropic etching of the semiconductor layer to form a trench that reaches the second insulation layer and divides the semiconductor layer into a movable portion having a beam structure a beam. The method further includes performing a selective etching of the second insulation layer through the trench to remove the second insulation layer directly below the movable portion so that the movable portion moves upon application of a dynamic quantity. The projection extends in the planar direction of the semiconductor substrate to cross the beam of the movable portion.

According to an eighth aspect of the present invention, a semiconductor dynamic quantity sensor includes a semiconductor substrate having a thickness direction and a planar direction perpendicular to the thickness direction, a first insulation layer on a surface of the semiconductor substrate, a lower wiring portion located on the first insulation layer and made of an electrically conductive material, a projection located on the first insulation layer and made of the same conductive material as the lower wiring portion, a second insulation layer on the lower wiring portion, and a semiconductor layer on the second insulation layer. The semiconductor layer defines a through hole extending in the thickness direction of the semiconductor substrate and divides the semiconductor layer into a movable portion having a beam structure including a beam. The movable portion is configured to move upon application of a dynamic quantity. The projection extends in the planar direction of the semiconductor substrate to cross the beam of the movable portion and is separated from the movable portion in the thickness direction of the semiconductor substrate to form a space therebetween. The space communicates with the through hole.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

Embodiments of the present invention are described below with reference to the drawings.

First Embodiment

Figure 1:
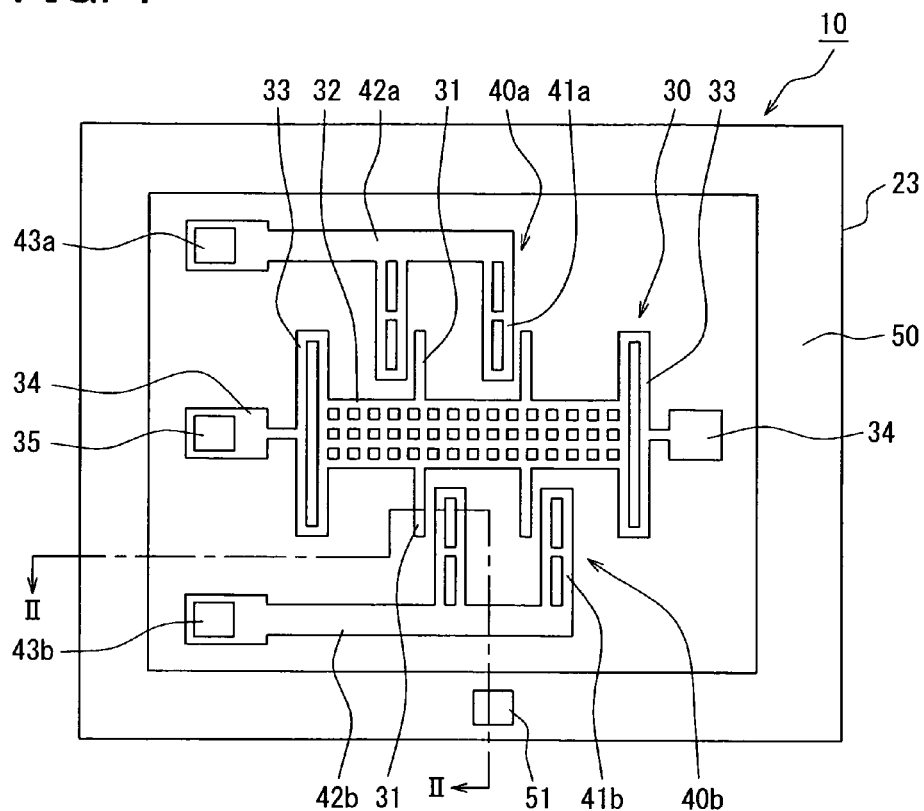
FIG. 1 is a diagram illustrating a plan view of a semiconductor dynamic quantity sensor according to a first embodiment of the present invention.
Figure 2:
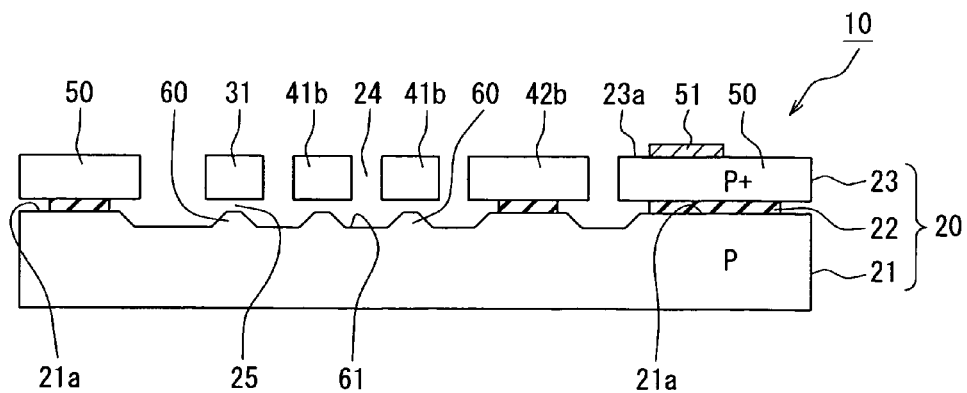
FIG. 2 is a diagram illustrating a cross-sectional view taken along the line II-II in FIG. 1.

FIG. 1 is a plan view of a semiconductor dynamic quantity sensor 10 according to a first embodiment of the present invention. FIG. 2 is a cross-sectional view taken along the line II-II in FIG. 1.

The semiconductor dynamic quantity sensor 10 according to the first embodiment is configured as a capacitive acceleration sensor for detecting an acceleration as a dynamic quantity. Alternatively, the semiconductor dynamic quantity sensor 10 can be configured as a device other than a capacitive acceleration sensor, as long as the device has a movable portion that can be displaced according to an applied dynamic quantity. For example, the semiconductor dynamic quantity sensor 10 can be configured as a Microelectromechanical systems (MEMS) device such as a capacitive angular velocity sensor, a vibration sensor, a microphone, or a microscanner.

As shown in FIGS. 1 and 2, the semiconductor dynamic quantity sensor 10 includes a substrate 20. The substrate 20 includes a semiconductor substrate 21, an insulation layer 22 on a surface 21a of the semiconductor substrate 21, and a semiconductor layer 23 on the insulation layer 22. That is, in the semiconductor substrate 20, the semiconductor layer 23 is located on the semiconductor substrate 21 through the insulation layer 22. The semiconductor layer 23 is divided by a through hole (trench) 24 into multiple portions including a movable portion 30 that can be displaced in a predetermined direction according to an applied dynamic quantity (i.e., acceleration). The semiconductor substrate 21 has a projection 60 on the surface 21a. The projection 60 is located directly below the movable portion 30.

The semiconductor substrate 21 is made of monocrystalline silicon and has a main surface that is different from a (111) plane. For example, the main surface of the semiconductor substrate 21 can be a (100) plane or a (110) plane. A reason for this is that an etching rate of a (111) plane is much lower than an etching rate of any other plane in an alkaline etching of the semiconductor substrate 21 to form the projection 60.

The semiconductor layer 23 is made of P-type silicon and has an impurity concentration greater than an impurity concentration of the semiconductor substrate 21. That is, the semiconductor layer 23 is a P+-type silicon layer. The semiconductor layer 23 is located on the main surface of the semiconductor substrate 21 through the insulation layer 22.

For example, according to the first embodiment, the semiconductor substrate 21 is a P-type monocrystalline silicon substrate, has a main surface that is a (100) plane, and has a resistivity of from about $0.015\Omega\cdot cm$ to about $10\Omega\cdot cm$. The semiconductor layer 23 is a P+-type monocrystalline silicon layer, has a main surface that is a (100) plane, and has a resistivity of from about $0.0002\Omega\cdot cm$ to about $0.02\Omega\cdot cm$, preferably from about $0.0002\Omega\cdot cm$ to about $0.002\Omega\cdot cm$. The main surface of the semiconductor substrate 21 and the main surface of the semiconductor layer 23 are bonded together through the insulation layer 22 to form the substrate 20 as a SOI substrate. The insulation layer 22 can be a thermal silicon oxide layer, a chemical vapor deposition (CVD) silicon oxide layer, or the like.

As described above, according to the first embodiment, the semiconductor layer 23 is highly doped with a P-type impurity such as boron. Since the impurity concentration of the semiconductor layer 23 is greater than the impurity concentration of the semiconductor substrate 21, the semiconductor layer 23 is resistant to an alkaline etching solution. That is, it is less likely that the semiconductor layer 23 is etched by an alkaline etching solution.

The semiconductor layer 23 can be a highly-doped P-type (i.e., P+-type) polycrystalline silicone layer instead of a highly-doped P-type (i.e., P+-type) monocrystalline silicon layer. In this case, the semiconductor layer 23 can be formed on the insulation layer by a CVD method, for example. The substrate 20 can be a silicon implanted oxide (SIMOX) substrate instead of a SOI substrate. The semiconductor substrate 21 can be a N-type monocrystalline silicon substrate instead of a P-type monocrystalline silicon substrate. The insulation layer 22 cannot be limited to a single layer of silicon oxide. For example, the insulation layer 22 can be a single layer of silicon nitride or a multilayer of silicon oxide and silicon nitride.

The substrate 20 is micromachined in a conventional manner to form the through hole (trench) 24 extending in a thickness direction of the substrate 20. The through hole (trench) 24 penetrates the semiconductor layer 23 and the insulation layer 22. The semiconductor layer 23 is divided by the through hole (trench) 24 into multiple portions including the movable portion 30, fixed portions 40a, 40b, and a peripheral portion 50. The fixed portions 40a, 40b are paired with the movable portion 30 to detect a dynamic quantity. The peripheral portion 50 surrounds the movable portion 30 and the fixed portions 40a, 40b.

The movable portion 30 has a beam structure including multiple beams extending in a planar direction of the substrate 20. The planar direction is perpendicular to the thickness direction. The movable portion 30 includes a movable electrode 31, a weight 32, and a spring 33. Each beam of the movable portion 30 has the same width.

As shown in FIG. 1, the weight 32 to which an acceleration is applied has a rectangular outer shape in plane. Further, the weight 32 has a mesh structure that allows the insulation layer 22 directly below the weight 32 to be removed by etching. That is, the weight 32 has a grid beam structure. The movable electrode 31 is cantilevered from each long side of the weight 32. Specifically, the movable electrode 31 extends perpendicularly from each long side of the weight 32. In an example shown in FIG. 1, two movable electrodes 31 are provided on each long side of the weight 32. The spring 33 has a rectangular frame shape and is joined to each short side of the weight 32. The spring 33 is joined to an anchor 34. The anchor 34 supports the movable portion 30 above the semiconductor substrate 21 through the insulation layer 22.

There is a space 25 directly below the movable electrode 31, the weight 32, and the spring 33 (i.e., each beam of the spring 33). The space 25 is formed by selectively etching the insulation layer 22. The space 25 allows the movable portion 30 to be movable.

Due to its rectangular frame shape, the spring 33 has elasticity in the long side direction of the weight 32. Therefore, when the weight 32 receives an acceleration having a component in the long side direction of, the weight 32, the spring 33 is deformed so that the movable electrode 31 and the weight 32 can be displaced in the long side direction of the weight 32. Then, when the acceleration disappears, the spring 33 returns to its original shape so that the movable electrode 31 and the weight 32 can return to their original positions.

It is noted that the long side direction and the short side direction of the weight 32 are equal to a <110> direction of the semiconductor substrate 21 having a main surface that is a (100) plane. A movable electrode pad 35 is formed on a surface 23a of the semiconductor layer 23 at a position corresponding to one of the anchors 34. The movable electrode pad 35 is formed by patterning a metal layer such as an aluminum layer. A surface opposite to the surface 23a of the semiconductor layer 23 is located on the insulation layer 22.

As described above, the movable portion 30 has multiple beams that are joined together to form the movable electrode 31, the weight 32, and the spring 33. The movable portion 30 is fixed to the anchors 34 at both ends.

The fixed portion 40a includes a fixed electrode 41a, a fixed electrode wire 42a, and a fixed electrode pad 43a. Likewise, the fixed portion 40b includes a fixed electrode 41b, a fixed electrode wire 42b, and a fixed electrode pad 43b. The fixed electrode wire 42a serves as a wire for electrically connecting the fixed electrode 41a to the fixed electrode pad 43a and also serves as an anchor for supporting the fixed electrode 41a. Likewise, the fixed electrode wire 42b serves as a wire for electrically connecting the fixed electrode 41b to the fixed electrode pad 43b and also serves as an anchor for supporting the fixed electrode 41b.

Each of the fixed electrode wires 42a, 42b extends in parallel to the weight 32. The fixed electrode 41a extends from the fixed electrode wire 42a in a direction parallel to the movable electrode 31 on one long side of the weight 32 and is located facing the movable electrode 31 at a predetermined separation distance so as to form a first capacitor therebetween. The number of the fixed electrodes 14a is equal to the number of the movable electrodes 31 on one long side of the weight 32. Likewise, the fixed electrode 41b extends from the fixed electrode wire 42b in a direction parallel to the movable electrode 31 on the other long side of the weight 32 and is located facing the movable electrode 31 at a predetermined separation distance so as to form a second capacitor therebetween. The number of the fixed electrodes 14b is equal to the number of the movable electrodes 31 on the other long side of the weight 32.

The space 25 is also formed directly below the fixed electrodes 41a, 41b by selectively etching the insulation layer 22. Thus, the fixed electrodes 41a, 41b are cantilevered from the fixed electrode wires 42a, 42b, respectively. That is, like the movable portion 30, the fixed electrodes 41a, 41b have a beam structure. The width of each beam of the fixed electrodes 41a, 41b is equal to the width of each beam of the movable portion 30. As shown in FIG. 1, the fixed electrodes 41a, 41b have a slit for adjusting the width of each beam.

Upon application of an acceleration, a capacitance of one of the first and second capacitors increases while a capacitance of the other of the first and second capacitors decreases. In this way, a differential amplification is performed.

The fixed electrode pads 43a, 43b are formed on the surface 23a of the semiconductor layer 23 at positions corresponding to the fixed electrode wires 42a, 42b, respectively.

Further, a pad 51 is formed on the surface 23a of the semiconductor layer 23 at a position corresponding to the peripheral portion 50. The peripheral portion 50 can be fixed to a predetermined electrical potential through the pad 51.

The surface 21a of the semiconductor substrate 21 is recessed directly below the through hole (trench) 24 to form a recess 61 that communicates with the through hole (trench) 24. The recess 61 has a predetermined depth measured from an interface between the insulation layer 22 and the surface 21a of the semiconductor substrate 21. According to the first embodiment, the recess 61 is configured as a substantially U-shaped trench having a bottom surface directly below the through hole (trench) 24. The bottom surface of the recess 61 is a (100) plane, and a side surface of the recess 61 is a (111) plane.

As a result of forming the recess 61, the projection 60 is formed adjacent to the recess 61 so that the side surface of the recess 61 can be shared as a side surface of the projection 60. The projection 60 projects from the bottom surface of the recess 61 toward the movable portion 30. The projection 60 is trapezoidal or triangular in cross section and located directly below the movable portion 30. Specifically, the projection 60 is located directly below each beam of the movable portion 30. The width of a tip of the projection 60 is less than the width of a corresponding beam in the planar direction of the substrate 20. For example, as shown in FIG. 2, the width of the projection 60 directly below the movable electrode 31, which is configured as a single beam, is less than the width of the movable electrode 31. Although not shown in the drawings, the width of the projection 60 directly below a corresponding beam of the weight 32 is less than the width of the corresponding beam of the weight 32. Likewise, the width of the projection 60 directly below a corresponding beam of the spring 33 is less than the width of the corresponding beam of the spring 33.

As described above, according to the first embodiment, the long side direction and the short side direction of the weight 32 are equal to a <110> direction of the semiconductor substrate 21. Therefore, the projection 60 becomes trapezoidal or triangular in cross section in both the long side direction and the short side direction of the weight 32. It is noted that a distance between the tip of the projection 60 and the corresponding beam of the movable portion 30 is equal to the thickness of the insulation layer 22 in the thickness direction of the substrate 20. That is, as shown in FIG. 2, the tip of the projection 60 is located at the same position (i.e., height) as the interface between the insulation layer 22 and the surface 21a of the semiconductor substrate 21 in the thickness direction of the substrate 20.

According to the first embodiment, the projection 60 is trapezoidal in cross section and formed directly below each beam of the fixed electrodes 41a, 41b of the fixed portions 40a, 40b in addition to each beam of the movable portion 30. Alternatively, the projection 60 directly below the fixed portions 40a, 40b can be unnecessary.

Next, a method of manufacturing the semiconductor dynamic quantity sensor 10 shown in FIGS. 1, 2 is described below with reference to FIGS. 3-7.

Figure 3:
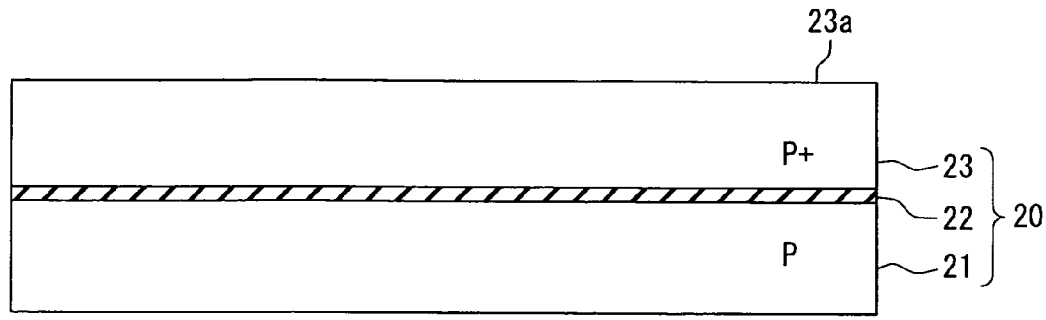
FIG. 3 is a diagram illustrating a method of manufacturing the semiconductor dynamic quantity sensor according to the first embodiment.
Figure 4:
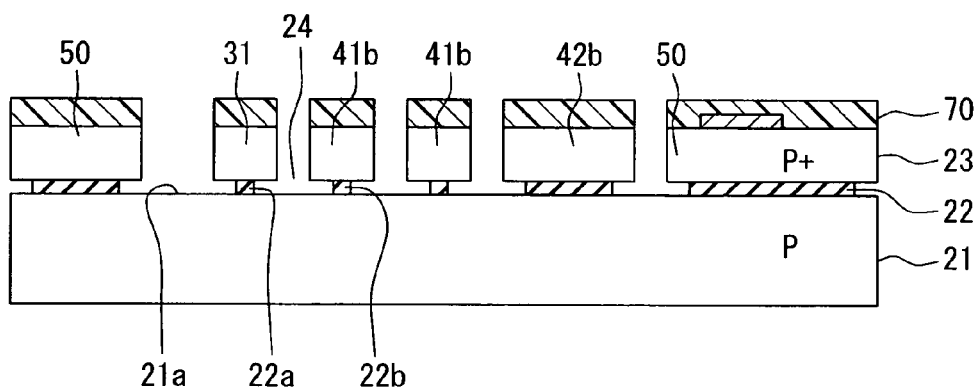
FIG. 4 is a diagram illustrating the method of manufacturing the semiconductor dynamic quantity sensor according to the first embodiment.

Firstly, in a process shown in FIG. 3, the substrate 20 is prepared. The substrate 20 includes the semiconductor substrate 21, the insulation layer 22, and the semiconductor layer 23. The semiconductor substrate 21 is made of monocrystalline silicon and has a main surface that is a (100) plane. The semiconductor layer 23 is made of P+-type silicon and has an impurity concentration greater than an impurity concentration of the semiconductor substrate 21. The semiconductor layer 23 is placed on the main surface of the semiconductor substrate 21 through the insulation layer 22. It is noted that the substrate 20 has a wafer-shape at the time of the process shown in FIG. 3.

For example, as described previously, the semiconductor substrate 21 can be a P-type monocrystalline silicon substrate having a main surface that is a (100) plane and having a resistivity of from about 0.01Ω·cm to about 10Ω·cm. The semiconductor layer 23 can be a highly-doped P-type (i.e., P+-type) monocrystalline silicon layer having a main surface that is a (100) plane and having a resistivity of from about 0.0002Ω·cm to about 0.02Ω·cm, preferably from about 0.0002Ω·cm to 0.002Ω·cm. The main surface of the semiconductor substrate 21 and the main surface of the semiconductor layer 23 are bonded together through the insulation layer 22 to form the substrate 20 as a SOI substrate. The insulation layer 22 can be a thermal silicon oxide layer, a CVD silicon oxide layer, or the like. It is noted that when the semiconductor layer 23 has the above resistivity, it is less likely that the semiconductor layer 23 is etched in an alkaline etching of the semiconductor substrate 21.

Next, the semiconductor layer 23 is thinned to a predetermined thickness (e.g., about 5 µm to about 50 µm) by chemical mechanical polishing (CMP) or the like. Then, in a process shown in FIG. 4, a metal layer (e.g., aluminum layer) having a predetermined thickness (e.g., about 0.2 µm to about 2 µm) is formed on the surface 23a of the semiconductor layer 23. Then, a wiring portion including the movable electrode pad 35, the fixed electrode pads 43a, 43b, and the pad 51 is formed by patterning the metal layer on the surface 23a of the semiconductor layer 23. Although the metal layer is formed on the surface 23a of the semiconductor layer 23, there is no need to form a Ohmic contact region on the surface 23a of the semiconductor layer 23 because the semiconductor layer 23 is of P-type.

After the wiring portion is formed, a mask 70 such as a resist is formed on the surface 23a of the semiconductor layer 23 so that the wiring portion can be covered with the mask 70. Then, an anisotropic etching of the semiconductor layer 23 is performed from the surface 23a side by using mask 70 to form a trench 24a in the semiconductor layer 23. The trench 24a extends in the thickness direction of the substrate 20 and reaches the insulation layer 22 by penetrating the semiconductor layer 23. For example, the trench 24a can be formed by reactive ion etching (RIE). As a result, the semiconductor layer 23 is divided by the trench 24a into multiple portions including the movable portion 30, the fixed portions 40a, 40b, and the peripheral portion 50. It is noted that the semiconductor layer 23 is patterned (i.e., divided) in such a manner that the long side direction and the short side direction of the weight 32 can be equal to a <110> direction of the semiconductor substrate 21. In other words, the semiconductor layer 23 is patterned in such a manner that the length direction and the width direction of each beam of the movable portion 30 can be equal to a <110> direction of the semiconductor substrate 21.

After the trench 24a is formed in the semiconductor layer 23, a selective etching of the insulation layer 22 is performed through the trench 24a by using the mask 70. As a result, the trench 24a is elongated to the surface 21a of the semiconductor substrate 21 and thus changes to the through hole (trench) 24 that penetrates the semiconductor layer 23 and the insulation layer 22. Further, the insulation layer 22 is etched so that the width of an insulation layer 22a located directly below a corresponding beam of the movable portion 30 can be less than the width of the corresponding beam of the movable portion 30 in the planar direction of the substrate 20.

For example, the trench 24a is elongated by RIE in the thickness direction of the substrate 20 so that the trench 24a can reach the surface 21a of the semiconductor substrate 21. Thus, the trench 24a changes to the through hole (trench) 24 that penetrates the semiconductor layer 23 and the insulation layer 22. Then, a hydrofluoric (HF) acid or vapor etching of the insulation layer 22 is performed in the planar direction of the substrate 20 until the width of the insulation layer 22a located directly below a corresponding beam of the movable portion 30 becomes less than the width of the corresponding bean of the movable portion 30. As mentioned previously, each of the fixed electrodes 41a, 41b has a beam structure, and the width of each beam of the movable portion 30 is equal to the width of each beam of the fixed electrodes 41a, 41b. Therefore, as a result of the etching through the through hole (trench) 24, the width of an insulation layer 22b located directly below a corresponding beam of the fixed electrodes 41a, 41b becomes less than the width of the corresponding beam of the fixed electrodes 41a, 41b.

In the above example, the through hole (trench) 24 is formed by a RIE etching of the insulation layer 22, and the width of the insulation layer 22a is reduced less than the width of the corresponding beam of the movable portion 30 by a HF acid or vapor etching of the insulation layer 22a. That is, forming the through hole (trench) 24 and reducing the width of the insulation layer 22a are performed in different processes. Alternatively, both forming the through hole (trench) 24 and reducing the width of the insulation layer 22a can be performed in the same process by a HF acid or vapor etching of the insulation layer 22.

Figure 5:
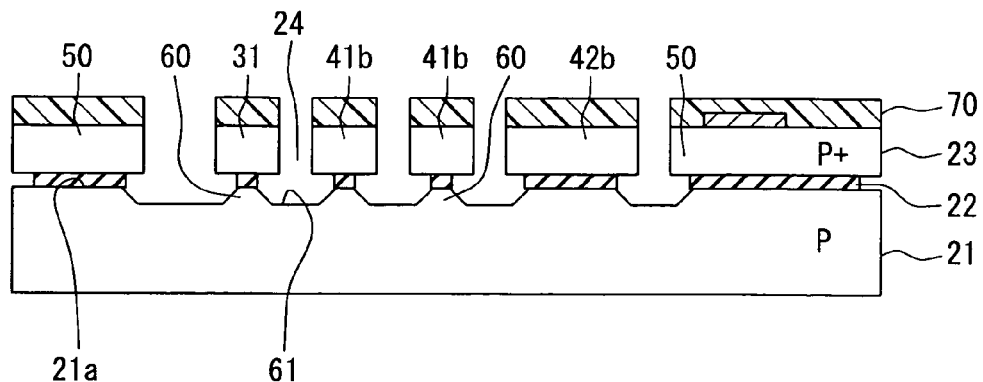
FIG. 5 is a diagram illustrating the method of manufacturing the semiconductor dynamic quantity sensor according to the first embodiment.
Figure 6:
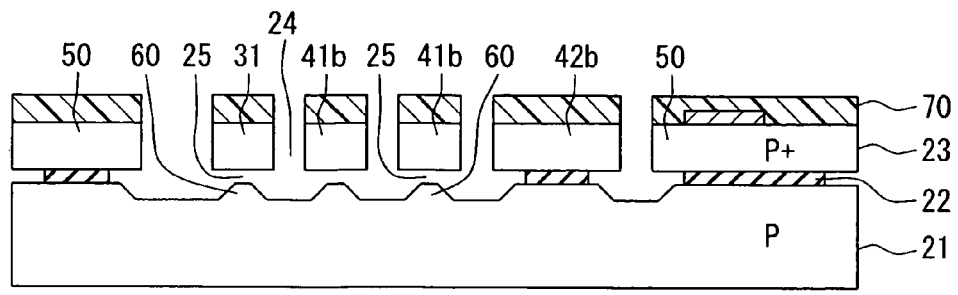
FIG. 6 is a diagram illustrating the method of manufacturing the semiconductor dynamic quantity sensor according to the first embodiment.

Then, in a process shown in FIG. 5, a selective etching of the semiconductor substrate 21 is performed through the through hole (trench) 24 by using the mask 70 and an alkaline etching solution so that the projection 60 and the recess 61 can be formed on the surface 21a of the semiconductor substrate 21. Examples of the alkaline etching solution can include a potassium hydroxide (KOH) solution and a tetramethylammonium hydroxide (TMAH) solution.

Since the semiconductor layer 23 is a highly-doped P-type (i.e., P+-type) substrate, the semiconductor layer 23 including the movable portion 30, the fixed portions 40a, 40b, and the peripheral portion 50 is resistant to an alkaline etching solution. Therefore, it is less likely that the semiconductor layer 23 is etched by the above alkaline etching. Conversely, the semiconductor substrate 21, which has an impurity concentration less than that of the semiconductor layer 23, is anisotropically etched according to crystal plane orientation.

Specifically, the recess 61 is formed directly below the through hole (trench) 24 due to the fact that the surface 21a of the semiconductor substrate 21 is a (100) plane and that the insulation layer 22 (i.e., 22a, 22b) serves as a mask. The side surface of the recess 61 is a (111) plane and forms an angle of 54.7° with the (100) plane. Since the insulation layer 22 serves as a mask, the projection 60 is formed directly below a corresponding beam of the movable portion 30. The projection 60 is located adjacent to the recess 61 and surrounded by the recess 61. The etching in the process shown in FIG. 5 is finished before the tip of the projection 60 is separated from the insulation layer 22. Thus, the tip of the projection 60 remains contact with the insulation layer 22.

As a result of the anisotropic etching that uses alkaline etching solution, the width of the tip of the projection 60 becomes less than the width of each beam of the movable portion 30 located directly above the projection 60. The width of the tip of the projection 60 is equal to or less than the insulation layer 22a located directly above the projection 60. The projection 60 has a trapezoidal or triangular shape in cross section and has a contact with the insulation layer 22a. In the first embodiment, each of the long side direction and the short side direction of the weight 32 is equal to a <110> direction of the semiconductor substrate 21. Therefore, the projection 60 can have a trapezoidal or triangular shape in cross section in each of the long side direction and the short side direction of the weight 32. Further, as a result of the anisotropic etching, the projection 60 is formed directly below the fixed electrodes 41a, 41b.

After the projection 60 and the recess 61 are formed, cleaning is performed to remove the etching solution. Then, in a process shown in FIG. 6, a selective etching is performed through the through hole (trench) 24 by using HF acid or vapor to remove the insulation layer 22a located directly below the movable portion 30. As a result of the selective etching, the space 25 is formed directly below the movable portion 30 so that the movable portion 30 can be movable. Further, as a result of the selective etching, the insulation layer 22b located directly below the fixed electrodes 41a, 41b is removed. Therefore, the space 25 is formed directly below the fixed electrodes 41a, 41b so that the fixed electrodes 41a, 41b can be suspended.

Figure 7:
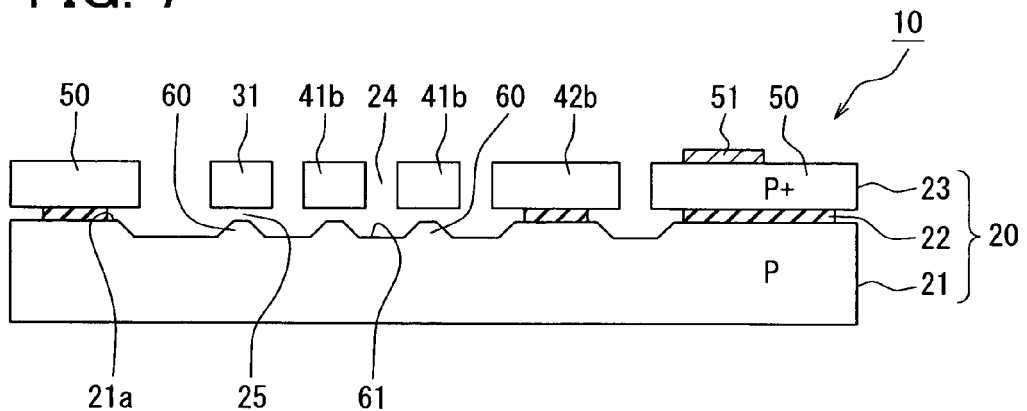
FIG. 7 is a diagram illustrating the method of manufacturing the semiconductor dynamic quantity sensor according to the first embodiment.

Then, in a process shown in FIG. 7, the mask 70 is removed by plasma etching or the like. Then, a wafer dicing is performed to form individual semiconductor dynamic quantity sensors 10.

As describe above, according to the first embodiment, the semiconductor substrate 21 is a monocrystalline silicon substrate and has a main surface that is a (100) plane. The semiconductor layer 23 is a highly-doped P-type (i.e., P+-type) layer and has a higher impurity concentration than the semiconductor substrate 21. An etching of the semiconductor substrate 21 is performed through the through hole (trench) 24 (i.e., trench 24a) by using an alkaline etching solution. Since the highly-doped P-type semiconductor layer 23 is resistant to an alkaline etching solution, the semiconductor substrate 21 is selectively etched so that the projection 60 can be formed.

In the etching of the semiconductor substrate 21, the projection 60 is formed in such a manner that the tip of the projection 60 remains contact with the semiconductor layer 22a (and 22b). After the projection 60 is formed, a selective etching of the insulation layer 22 is performed to remove the insulation layer 22a located directly below the movable portion 30. In such an approach, the projection 60 can be correctly positioned with respect to the movable portion 30 in the planar direction of the substrate 20. Further, since the distance between the tip of the projection 60 and the movable portion 30 in the thickness direction of the substrate 20 depends on the thickness of the insulation layer 22, a variation in the distance can be prevented or reduced.

Further, prior to the etching of the semiconductor substrate 21, a selective etching of the insulation layer 22 is performed through the trench 24a in the semiconductor layer 23 so that the trench 24a can change to the through hole (trench) 24 that reaches the semiconductor substrate 21 and that the width of the insulation layer 22a directly below the movable portion 30 can be less than the width of the movable portion 30. Then, an anisotropic etching of the semiconductor substrate 21 is performed to form the projection 60 by using an alkaline etching solution. In this etching, the insulation layer 22a is used as a mask. Therefore, the projection 60 can be correctly positioned with respect to the movable portion 30 in the planar direction of the substrate 20. That is, the projection 60 can be located directly below the movable portion 30. Since the width of the tip of the projection 60 is narrow, a facing area between the movable portion 30 and the projection 60 is small so that it is less likely that the movable portion 30 sticks to the projection 60.

In particular, according to the first embodiment, the width of the insulation layer 22a, which is used as a mask for the etching of the semiconductor substrate 21, is reduced prior to the etching of the semiconductor substrate 21. Therefore, the width of the tip of the projection 60 can be easily reduced by using the insulation layer 22a as a mask.

The projection 60 is formed in the semiconductor substrate 21 by using the through hole (trench) 24 (i.e., trench 24a). The mask (i.e., insulation layer 22a) is formed by partially removing the insulation layer 22 located directly below the movable portion 30, and the projection 60 is formed in the semiconductor substrate 21 by using the mask. In this way, the projection 60 is formed easily so that manufacturing cost can be reduced.

The first embodiment can be modified in various ways, for example, as follows.

According to the first embodiment, the main surface of the semiconductor substrate 21 is a (100) plane. The main surface of the semiconductor substrate 21 can be any other plane except a (111) plane. For example, the main surface of the semiconductor substrate 21 can be a (110) plane. Even in such a case, the projection 60 can have a trapezoidal or triangular shape in cross section in at least one of the long side direction and the short side direction of the weight 32 due to a difference in an etching rate between the planes.

Figure 8:
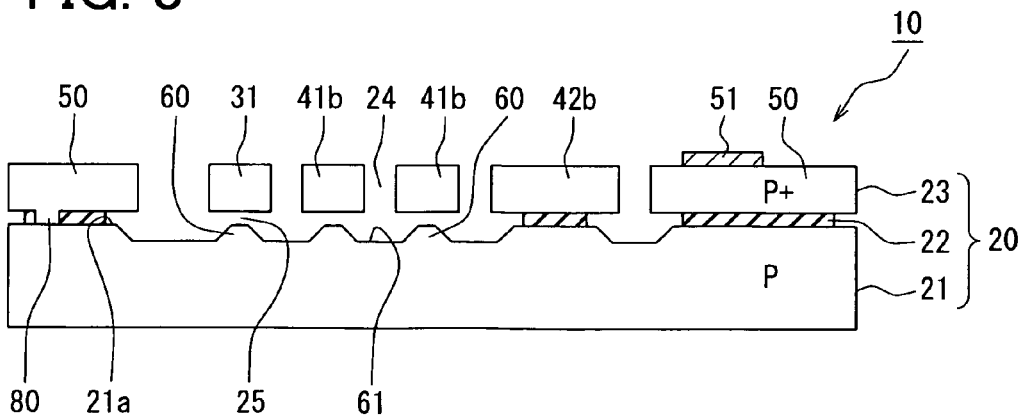
FIG. 8 is a diagram illustrating a cross-sectional view of a semiconductor dynamic quantity sensor according to a first modification of the first embodiment.

According to the first embodiment, the semiconductor substrate 21 is not fixed to a predetermined electrical potential. In other words, the semiconductor substrate 21 has a floating potential. Alternatively, the semiconductor substrate 21 can have the same electrical potential as the semiconductor layer 23, when the semiconductor substrate 21 and the semiconductor layer 23 have the same conductivity type. For example, according to a first modification shown in FIG. 8, a contact 80 is formed in the insulation layer 22, and the semiconductor substrate 21 is electrically connected to the peripheral portion 50 of the semiconductor layer 23 through the contact 80. Thus, the semiconductor substrate 21 has the same electrical potential as the peripheral portion 50. In this way, the semiconductor substrate 21 can be fixed to a predetermined electrical potential (e.g., ground potential) through the pad 51, the semiconductor layer 23, and the contact 80. For example, the contact 80 can be formed by forming a through hole in the insulation layer 22 and then by depositing polysilicon on the insulation layer 22 to fill the through hole.

Figure 9:
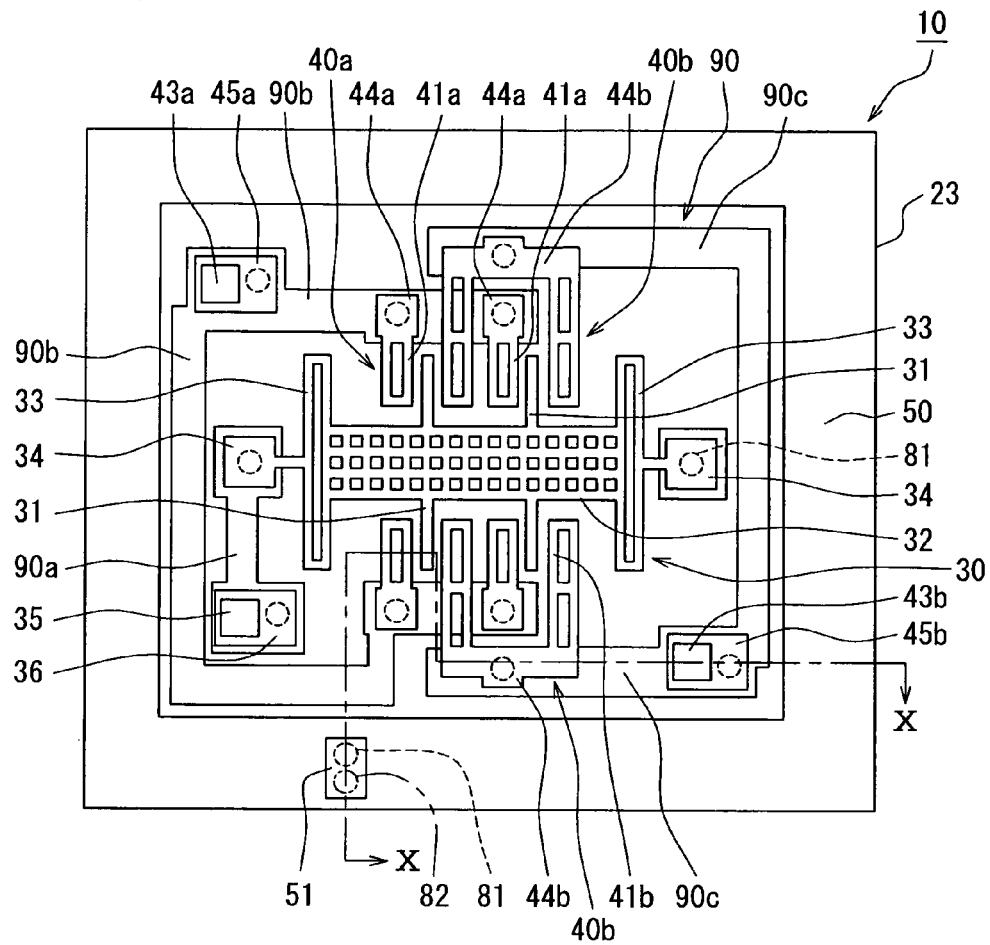
FIG. 9 is a diagram illustrating a plan view of a semiconductor dynamic quantity sensor according to a second modification of the first embodiment.
Figure 10:
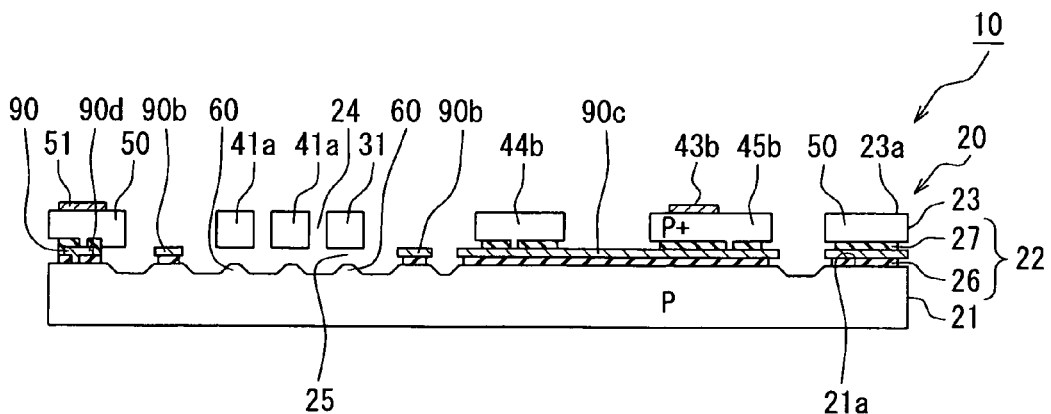
FIG. 10 is a diagram illustrating a cross-sectional view taken along the line X-X in FIG. 9.

According to the first embodiment, there is no wiring portion between the semiconductor substrate 21 and the semiconductor layer 23. Alternatively, as shown in FIGS. 9 and 10, a lower wiring portion 90 can be provided between the semiconductor substrate 21 and the semiconductor layer 23. For example, the lower wiring portion 90 is located inside the insulation layer 22 and electrically connected to each of the semiconductor substrate 21 and the semiconductor layer 23 through a contact in the insulation layer 22. Thus, the lower wiring portion 90 electrically connects the semiconductor substrate 21 and the semiconductor layer 23. In this way, the lower wiring portion 90 can serve as a cross wiring for electrically connecting portions that are arranged in a three dimensional manner. Further, the lower wiring portion 90 electrically connects the multiple portions into which the semiconductor layer 23 is divided by the through hole (trench) 24.

Specifically, according to a second modification shown in FIGS. 9 and 10, the insulation layer 22 has a multilayer structure and includes a first insulation layer 26 and a second insulation layer 27. The lower wiring portion 90 is located on the surface 21a of the semiconductor substrate 21 through the first insulation layer 26. The second insulation layer 27 is located on the first insulation layer 26 so that the lower wiring portion 90 can be covered with the second insulation layer 27. The semiconductor layer 23 is located on the second insulation layer 27. The lower wiring portion 90 is made of highly-doped P-type (i.e., P+-type) polycrystalline. The semiconductor layer 23 is made of highly-doped P-type (i.e., P+-type) polycrystalline.

The lower wiring portion 90 includes a first wire 90a, a second wire 90b, a third wire 90c, and a fourth wire 90d. The first wire 90a electrically connects the anchor 34 of the movable portion 30 and an island 36 of the semiconductor layer 23. The movable electrode pad 35 is formed on the surface 23a of the semiconductor layer 23 at the island 36. The second wire 90b electrically connects the anchor 44a of the fixed portion 40a and an island 45a of the semiconductor layer 23. The fixed electrode pad 43a is formed on the surface 23a of the semiconductor layer 23 at the island 45a. The third wire 90c electrically connects the anchor 44b of the fixed portion 40b and an island 45b of the semiconductor layer 23. The fixed electrode pad 43b is formed on the surface 23a of the semiconductor layer 23 at the island 45b. The fourth wire 90d electrically connects the semiconductor substrate 21 and semiconductor layer 23.

In this way, the multiple portions, into which the semiconductor layer 23 is divided by the through hole (trench) 24, are electrically connected together by the wires 90a, 90b, 90c and a contact 81 in the second insulation layer 27. The semiconductor substrate 21 and the semiconductor layer 23 are electrically connected together by the wire 90c, the contact 81, and a contact 82 in the first insulation layer 26.

Next, a method of manufacturing the semiconductor dynamic quantity sensor 10 shown in FIGS. 9 and 10 is described below. For the sake of simplicity, the method of manufacturing the semiconductor dynamic quantity sensor 10 shown in FIGS. 9 and 10 is described based on a simplified model shown in FIG. 11.

Figure 12:
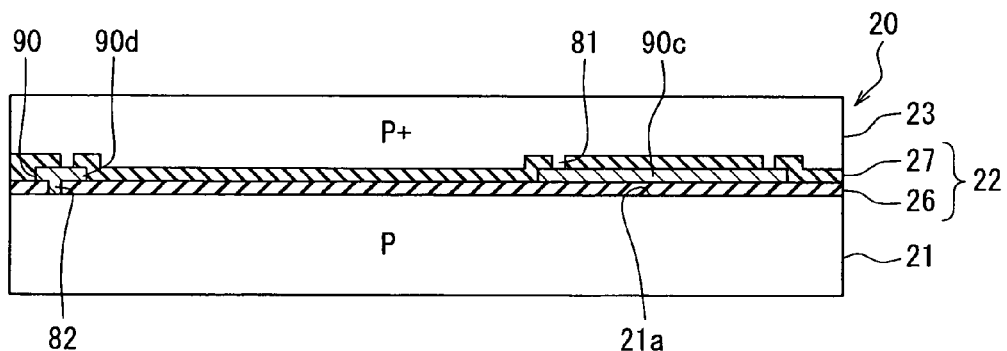
FIG. 12 is a diagram illustrating a method of manufacturing the simplified model of FIG. 11.

Firstly, in a process shown in FIG. 12, the substrate 20 is prepared. Specifically, a silicon oxide layer as the first insulation layer 26 is formed on the surface 21a of the semiconductor substrate 21. It is noted that the semiconductor substrate 21 is made of monocrystalline silicon and has a main surface that is a different from a (111) plane. For example, the semiconductor substrate 21 can be a P-type monocrystalline silicon substrate having a main surface that is a (100) plane.

Then, a through hole is formed in the first insulation layer 26. Then, a highly-doped P-type (i.e., P+-type) polycrystalline layer having a thickness of about 0.5 µm to about 2 µm is formed on the first insulation layer 26 to fill the through hole in the first insulation layer 26. Then, the highly-doped P-type polycrystalline layer on the first insulation layer 26 is patterned to form the contact 82 and the lower wiring portion 90. Then, a silicon oxide layer as the second insulation layer 27 is formed on the first insulation layer 26, for example, by CVD so that the lower wiring portion 90 can be covered with the second insulation layer 27. Then, a through hole is formed in the second insulation layer 27. Then, a highly-doped P-type (i.e., P+-type) polycrystalline layer having a thickness of about 5 µm to about 50 µm is formed on the second insulation layer 27 to fill the through hole in the second insulation layer 27. Thus, the contact 81 and the semiconductor layer 23 are formed.

Figure 11:
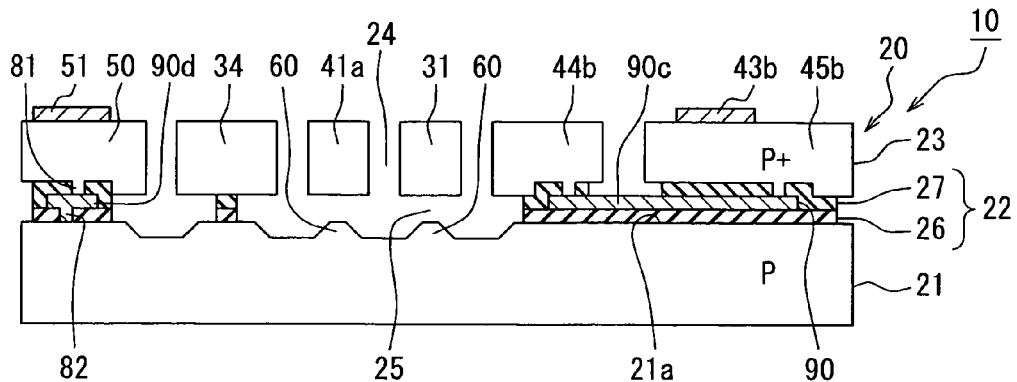
FIG. 11 is a diagram illustrating a cross-sectional view of a simplified model of the semiconductor dynamic quantity sensor according to the second modification of the first embodiment.
Figure 13:
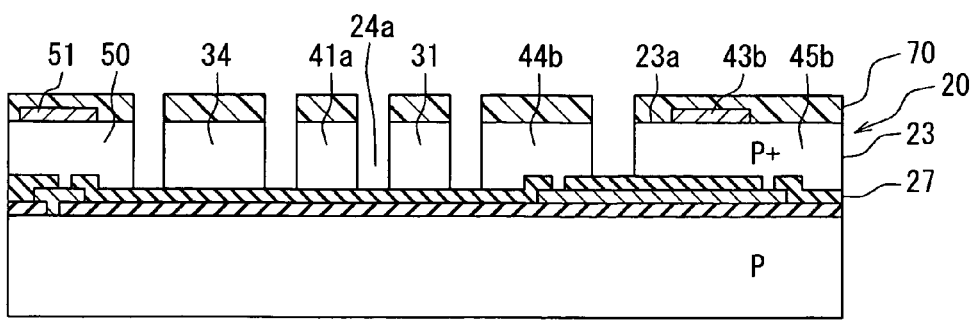
FIG. 13 is a diagram illustrating the method of manufacturing the simplified model of FIG. 11.
Figure 14:
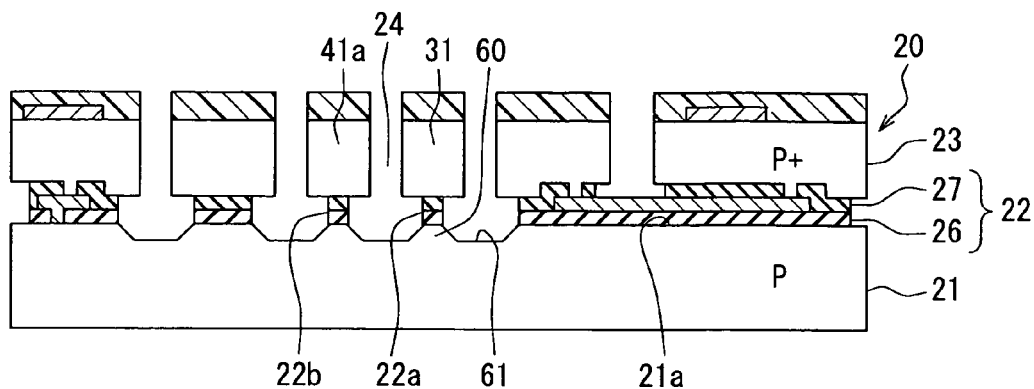
FIG. 14 is a diagram illustrating the method of manufacturing the simplified model of FIG. 11.

Then, in a process shown in FIG. 13, the wiring portion including the pads 43b, 51 is formed on the surface 23a of the semiconductor layer 23. Then, the trench 24a is formed in the semiconductor layer 23 by using the mask 70. Then, a selective etching of the insulation layer 22 is performed through the trench 24a. It is noted that the lower wiring portion 90 serves as an etching stopper for preventing the first insulation layer 26 directly below the lower wiring portion 90 to be etched. Therefore, the lower wiring portion 90 is formed in such a manner that the lower wiring portion 90 is not located directly below the trench 24a between adjacent beams of the movable portion 30. Then, an anisotropic etching of the semiconductor substrate 21 is performed by using the insulation layer 22a as a mask. As a result of the anisotropic etching, as shown in FIG. 14, the projection 60 and the recess 61 are formed on the surface 21a of the semiconductor substrate 21. Then, the insulation layers 22a, 22b are removed. In this way, the semiconductor dynamic quantity sensor 10 shown in FIG. 11 is manufactured.

Second Embodiment

Figure 15:
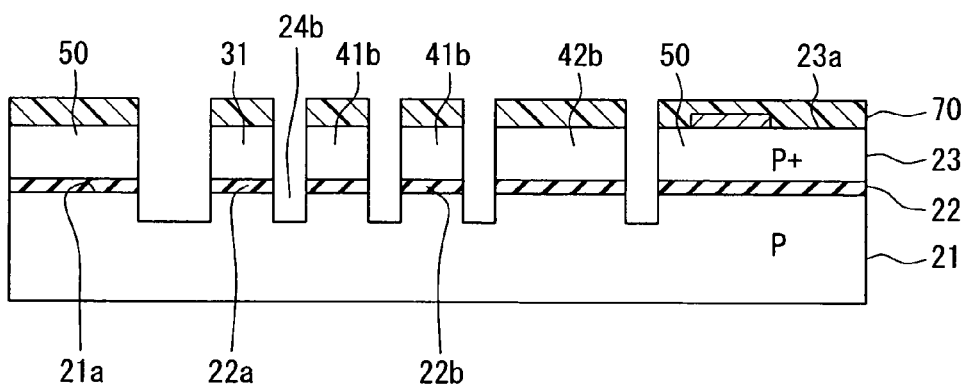
FIG. 15 is a diagram illustrating a method of manufacturing a semiconductor dynamic quantity sensor according to a second embodiment of the present invention.

A second embodiment of the present invention is describe below with reference to FIGS. 15 and 16.

A difference between the first and second embodiments is the method of manufacturing the semiconductor dynamic quantity sensor 10.

The method according to the second embodiment is as follows. Firstly, like the first embodiment, the substrate 20 shown in FIG. 3 is prepared. Then, in a process shown in FIG. 15, an anisotropic etching of the substrate 20 is performed, for example, by RIE. As a result of the anisotropic etching, a trench 24b is formed in the substrate 20. As shown in FIG. 15, the trench 24b extends in the thickness direction of the substrate 20, and reaches a predetermined depth of the semiconductor substrate 21 by penetrating the semiconductor layer 23 and the insulation layer 22. It is noted that the predetermined depth is measured from the surface 21a of the semiconductor substrate 21. The semiconductor layer 23 is divided by the trench 24b into multiple portions including the movable portion 30. For example, the trench 24b can be formed in such a manner that a trench is formed in the semiconductor layer 23 by RIE, elongated by RIE to penetrate the insulation layer 22, and then elongated by RIE to the predetermined depth of the semiconductor substrate 21.

Figure 16:
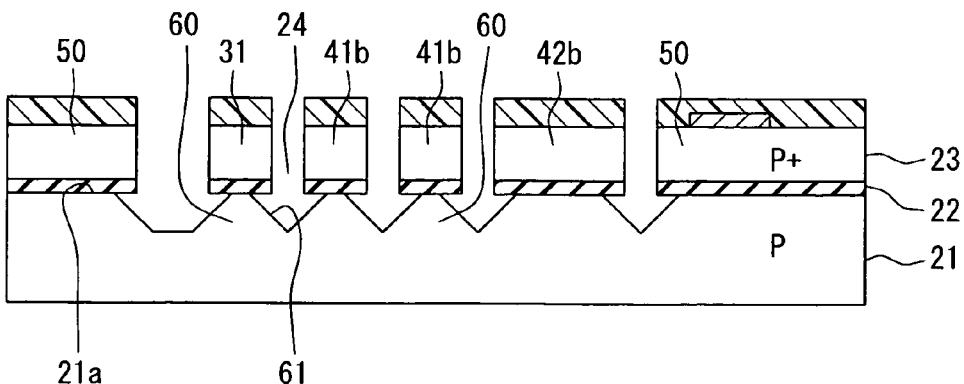
FIG. 16 is a diagram illustrating the method of manufacturing the semiconductor dynamic quantity sensor according to the second embodiment.

Next, in a process shown in FIG. 16, a selective etching of the semiconductor substrate 21 is performed through the trench 24b by using an alkaline etching solution. As described in the first embodiment, the semiconductor layer 23 is resistant to an alkaline etching solution because the semiconductor layer 23 is of a highly-doped P-type (i.e., P+-type). Therefore, the semiconductor substrate 21 is selectively etched. As a result of the selective etching of the semiconductor substrate 21, the projection 60 is formed on the surface 21a of the semiconductor substrate 21. As shown in FIG. 16, the projection 60 is trapezoidal or triangular in cross section, because the trench 24b reaches the predetermined depth. Therefore, there is no need to reduce the widths of the insulation layers 22a, 22b in the planar direction of the substrate 20. The tip of the projection 60 remains contact with the insulation layer 22. Since the projection 60 is trapezoidal or triangular in cross section, the width of the tip of the projection 60 directly below a corresponding beam of the movable portion 30 is less than the corresponding beam of the movable portion 30. In an example shown in FIG. 16, the trench 24b in the semiconductor substrate 21 is formed into a V-shaped recess 61 by the selective etching of the semiconductor substrate 21.

Then, like the first embodiment, the insulation layers 22a, 22b are removed, and a wafer dicing is performed. In this way, the semiconductor dynamic quantity sensor 10 having the substantially same structure as that shown in FIGS. 1 and 2 is manufactured.

As described above, according to the second embodiment, an anisotropic etching of the semiconductor substrate 21 is performed through the trench 24b that reaches the predetermined depth of the semiconductor substrate 21. In such an approach, the width of the tip of the projection 60 can be made less than the width of the movable portion 30 without etching the insulation layer 22 in the planar direction of the substrate 20 prior to the anisotropic etching of the semiconductor substrate 21. Therefore, as compared to the first embodiment, the manufacturing process is simplified so that the manufacturing cost can be reduced.

In the way, the method of the second embodiment can be applied to manufacture the semiconductor dynamic quantity sensor 10 of the first embodiment. Further, the method of the second embodiment can be applied to manufacture the semiconductor dynamic quantity sensor 10 of the modifications of the first embodiment.

As described above, according to the second embodiment, the etching of the insulation layer 22 is not performed prior to the anisotropic etching of the semiconductor substrate 21. Therefore, there is a possibility that the width of the tip of the projection 60 may be substantially equal to the width of the corresponding beam directly above the projection 60 in one of the long side direction and the short side direction of the weight 32, depending on a plain orientation of the main surface of the semiconductor substrate 21. However, as long as the width of the tip of the projection 60 is less than the width of the corresponding beam directly above the projection 60 in the other of the long side direction and the short side direction of the weight 32, the projection 60 can function normally.

Third Embodiment

Figure 17:
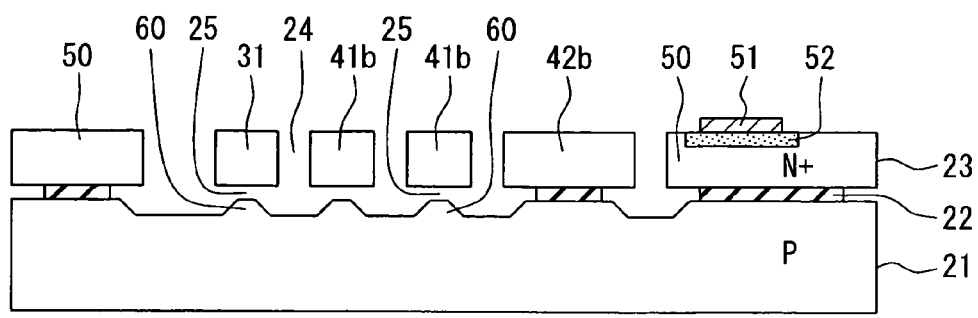
FIG. 17 is a diagram illustrating a cross-sectional view of a semiconductor dynamic quantity sensor according to a third embodiment of the present invention.
Figure 18:
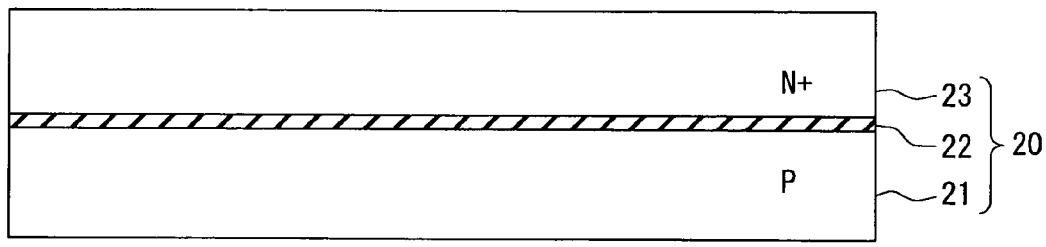
FIG. 18 is a diagram illustrating a method of manufacturing the semiconductor dynamic quantity sensor according to the third embodiment.

A semiconductor dynamic quantity sensor 10 according to a third embodiment of the present invention is described below with reference to FIGS. 17-22. FIG. 17 is a cross-sectional view illustrating the semiconductor dynamic quantity sensor 10 according to the third embodiment. FIGS. 18-22 are cross-sectional views illustrating a method of manufacturing the semiconductor dynamic quantity sensor 10 of FIG. 17.

A difference of the third embodiment from the preceding embodiments is as follows.

According to the first and second embodiments, a selective anisotropic etching of the semiconductor substrate 21 is performed based on a principle that an use of an alkaline etching solution substrate 20 can reduce the etching rate of a highly-doped P-type, so that it is less likely that the semiconductor layer 23 is etched. Conversely, according to the third embodiment, a selective anisotropic etching of the semiconductor substrate 21 is performed based on a principle that an application of a positive voltage to a N-type semiconductor can reduce the etching rate of the N-type semiconductor, so that it is less likely that the semiconductor layer 23 is etched.

As can be seen by comparing FIG. 17 with FIG. 2, the semiconductor dynamic quantity sensor 10 of the third embodiment has the substantially same structure as that of the first embodiment except for the following two differences. One difference is that the semiconductor layer 23 of the substrate 20 is of a highly-doped N-type (i.e., N+-type) instead of a highly-doped P-type. The other difference is that a contact region 52 of a highly-doped N-type (i.e., N+-type) is formed on the surface 23a of the semiconductor layer 23. The contact region 52 forms Ohmic contact with the wiring portion including the pad 51.

Next, a method of manufacturing the semiconductor dynamic quantity sensor 10 according to the third embodiment is described below. Firstly, in a process shown in FIG. 18, the substrate 20 is prepared. The substrate 20 includes the semiconductor substrate 21, the insulation layer 22, and the semiconductor layer 23. The semiconductor substrate 21 is made of monocrystalline silicon and has a main surface different from a (111) plane. The semiconductor layer 23 is made of N-type silicon. For example, the semiconductor substrate 21 can be a P-type monocrystalline silicon and have a main surface that is a (100) plane. For example, the semiconductor layer 23 can be a highly-doped N-type (i.e., N+-type) monocrystalline silicon layer having a main surface that is a (100) plane. The main surface of the semiconductor substrate 21 and the main surface of the semiconductor layer 23 are bonded together through the insulation layer 22 to form the substrate 20 as a SOI substrate. Then, the semiconductor layer 23 is thinned to a predetermined thickness (e.g., about 5 μm to about 50 μm) by CMP, for example.

Figure 19:
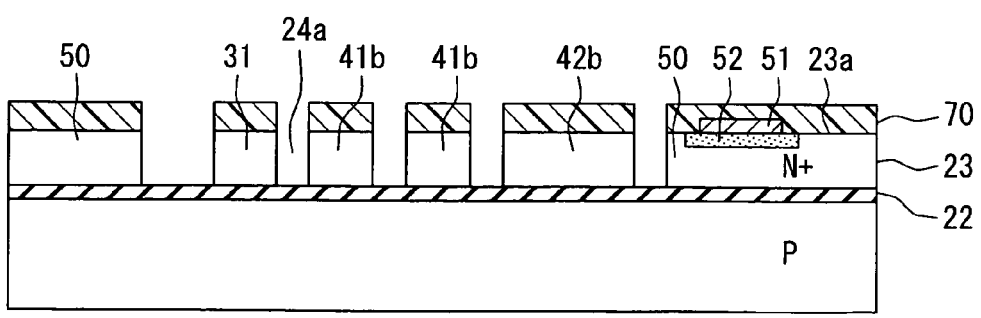
FIG. 19 is a diagram illustrating the method of manufacturing the semiconductor dynamic quantity sensor according to the third embodiment.

Then, in a process shown in FIG. 19, an N-type impurity is introduced into the surface 23a of the semiconductor layer 23 at a position corresponding to a contact region with the wiring portion including the pad 51, for example, by ion implantation. Thus, the contact region 52 is formed in the semiconductor layer 23. Alternatively, an N-type impurity can be introduced into the entire surface 23a of the semiconductor layer 23, because the semiconductor layer 23 is divided by the trench 24a into multiple portions later.

After the contact region 52 is formed, the following processes are performed like the first embodiment. Firstly, the wiring portion including the pad 51 is formed on the surface 23a of the semiconductor layer 23. For example, the wiring portion can be made of aluminum. At the same time, etching voltage application pads used for electrochemical etching discussed later are formed in the semiconductor layer 23. According to the third embodiment, the pads 35, 43a, 43b, 51, which are respectively formed on the surface 23a of the movable portion 30, the fixed portions 40a, 40b, and the peripheral portion 50, are used as the etching voltage application pads. Then, an anisotropic etching of the semiconductor layer 23 is performed from the surface 23a side by using the mask 70 on the surface 23a to from the trench 24a that extends in the thickness direction of the substrate 20 and reaches the insulation layer 22. As a result, the semiconductor layer 23 is divided into multiple portions including the movable portion 30, the fixed portions 40a, 40b, and the peripheral portion 50.

Figure 20:
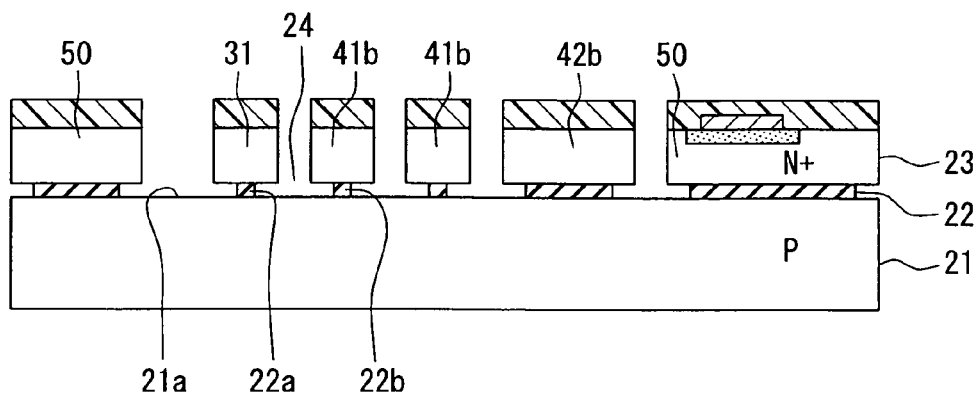
FIG. 20 is a diagram illustrating the method of manufacturing the semiconductor dynamic quantity sensor according to the third embodiment.

Then, in a process shown in FIG. 20, a selective etching of the insulation layer 22 is performed through the trench 24a by using the mask 70. As a result, the trench 24a is elongated to the surface 21a of the semiconductor substrate 21 and thus changes to the through hole (trench) 24 that penetrates the semiconductor layer 23 and the insulation layer 22. Further, the insulation layer 22 is etched so that the width of the insulation layer 22a located directly below a corresponding beam of the movable portion 30 can be less than the width of the corresponding beam of the movable portion 30 in the planar direction of the substrate 20.

Figure 21:
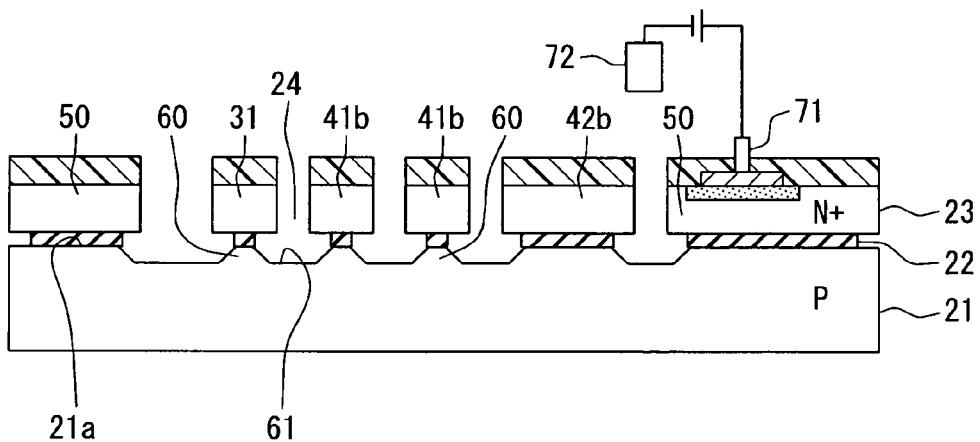
FIG. 21 is a diagram illustrating the method of manufacturing the semiconductor dynamic quantity sensor according to the third embodiment.
Figure 22:
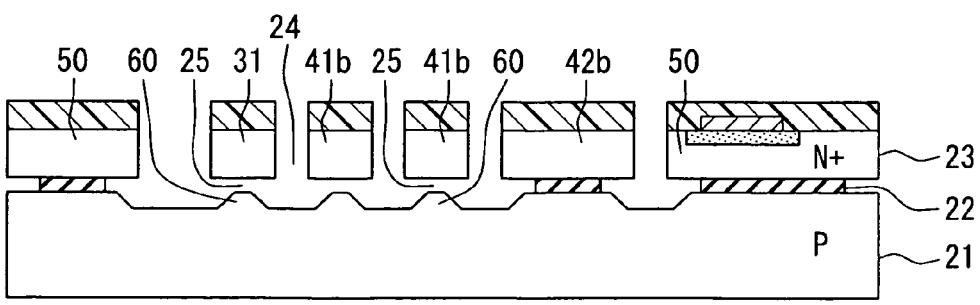
FIG. 22 is a diagram illustrating the method of manufacturing the semiconductor dynamic quantity sensor according to the third embodiment.

Next, in a process shown in FIG. 21, a selective etching of the semiconductor substrate 21 is performed through the through hole (trench) 24 by using the mask 70 and an alkaline etching solution, while applying a positive voltage to the semiconductor layer 23. Thus, the projection 60 and the recess 61 are formed on the surface 21a of the semiconductor substrate 21. Examples of the alkaline etching solution can include a potassium hydroxide (KOH) solution and a tetramethylammonium hydroxide (TMAH) solution.

Specifically, the electrochemical etching using an alkaline etching solution is performed as follows. Firstly, an etching prevention layer (not shown) is formed on a surface opposite to the surface 21a of the semiconductor substrate 21. For example, the etching protection layer can be made of a wax. Then, a platinum (Pt) wire 71 is connected to the etching voltage application pad on the surface 23a of the semiconductor layer 23 and fixed by a wax (not shown). Under this condition, the substrate 20 is soaked in an alkaline etching solution (e.g., TMAH solution), and a voltage of about 0V to about 20V is applied between the platinum wire 71 and a platinum electrode 72 in the etching solution.

In this way, a positive voltage is applied by the platinum wire 71 to the movable portion 30, the fixed portions 40a, 40b, and the peripheral portion 50 of the semiconductor layer 23 through the respective etching voltage application pads. As a result, holes are supplied to the semiconductor layer 23 so that the surface of the semiconductor layer 23 can be anodized. Therefore, the semiconductor layer 23, in particular, the movable portion 30, the fixed portions 40a, 40b, and the peripheral portion 50 are resistant to an alkaline etching solution. Conversely, an electric current flowing in the semiconductor substrate 21 is very little, because the insulation layer 22 is located between the semiconductor substrate 21 and the semiconductor layer 23. Therefore, the semiconductor substrate 21 is anisotropically etched by the alkaline etching solution according to crystal plane orientation. As a result of the anisotropic etching, like the first embodiment, the projection 60 (and the recess 61) is formed on the surface 21a in such a manner that the width of the tip of the projection 60 is less than the width of the corresponding beam of the movable portion 30 directly above the projection 60. Specifically, the tip of the projection 60 remains contact with the semiconductor layer 22a directly above the projection 60, and the width of the tip of the projection 60 is less than the width of the semiconductor layer 22a.

As described above, according to the third embodiment, the semiconductor layer 23 of the substrate 20 is of N-type, and an electrochemical etching of the semiconductor substrate 21 is performed through the through hole (trench) 24 in the semiconductor layer 23 by using an alkaline etching solution. In such an approach, a selective etching of the semiconductor substrate 21 is performed to form the projection 60 in such a manner that it is less likely that the semiconductor layer 23 is etched.

Further, according to the third embodiment, the semiconductor substrate 21 is of P-type. When, a P-type semiconductor substrate 21 is used, a direction from the semiconductor layer 23 to the semiconductor substrate 20 is a reverse bias direction. Therefore, anodization caused by an electric current flowing to the semiconductor substrate 21 side is prevented so that the semiconductor substrate 21 can be etched. Alternatively, because of the insulation layer 22, the semiconductor substrate 21 can be of N-type.

The method according to the third embodiment is discussed as a combination with the method of the first embodiment. Alternatively, the method according to the third embodiment can be combined with the method of the second embodiment to obtain the advantage discussed in the second embodiment.

Fourth Embodiment

Figure 23:
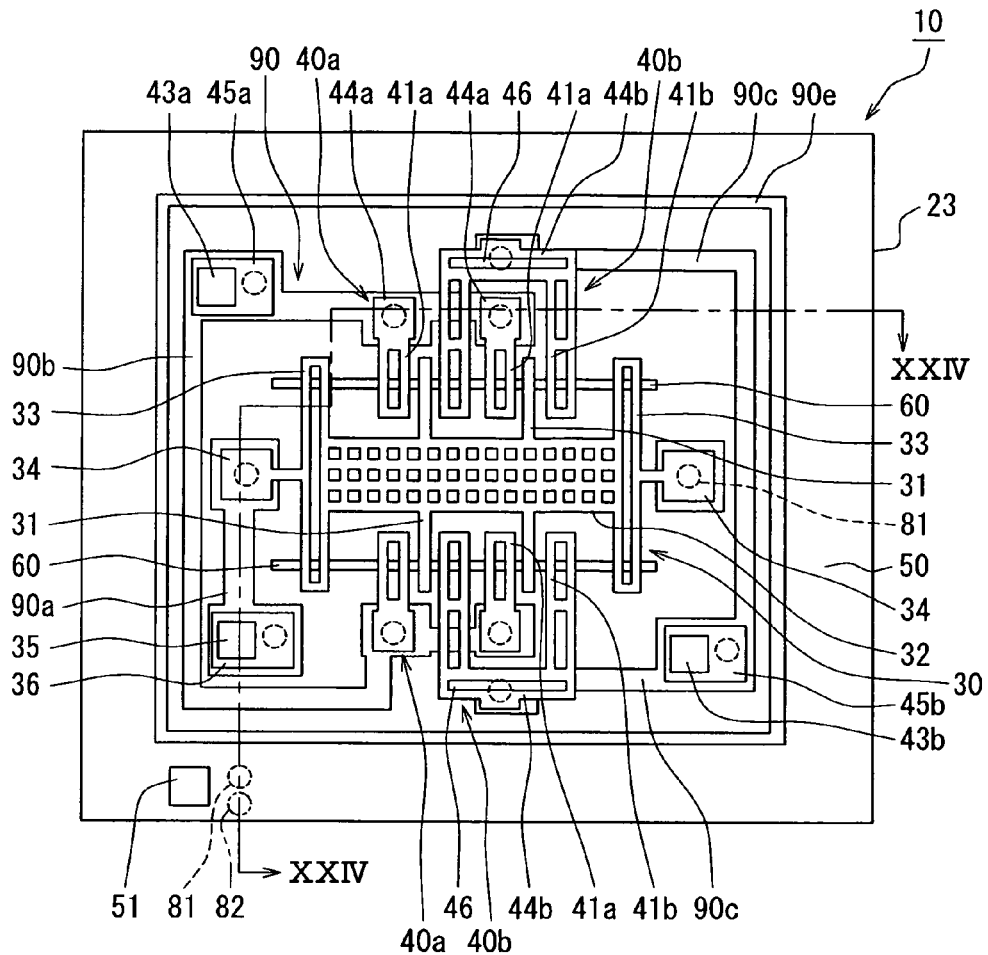
FIG. 23 is a diagram illustrating a plan view of a semiconductor dynamic quantity sensor according to a fourth embodiment of the present invention.
Figure 24:
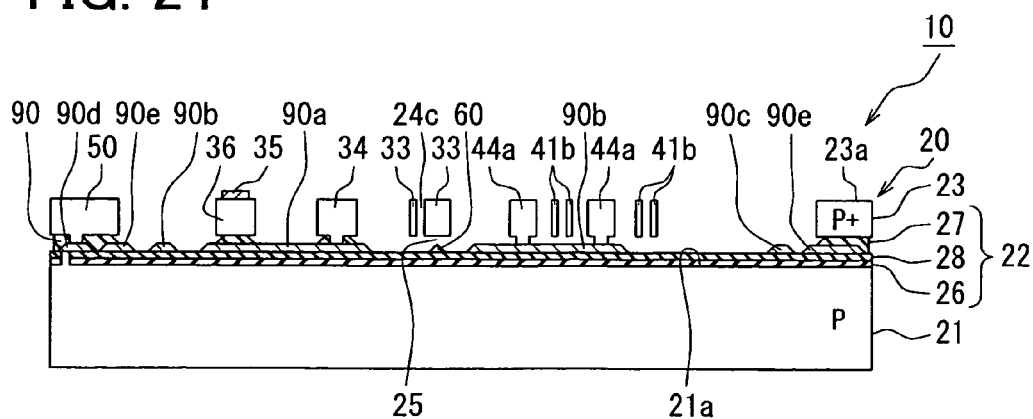
FIG. 24 is a diagram illustrating a cross-sectional view taken along the line XXIV-XXIV in FIG. 23.
Figure 25:
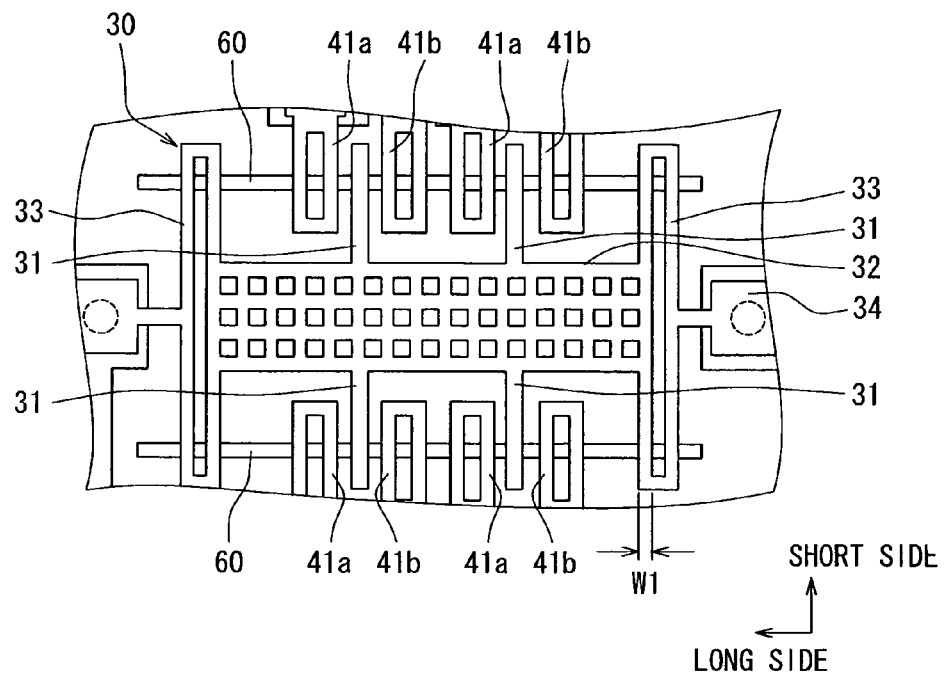
FIG. 25 is a diagram illustrating an enlarged view of FIG. 23.
Figure 26:
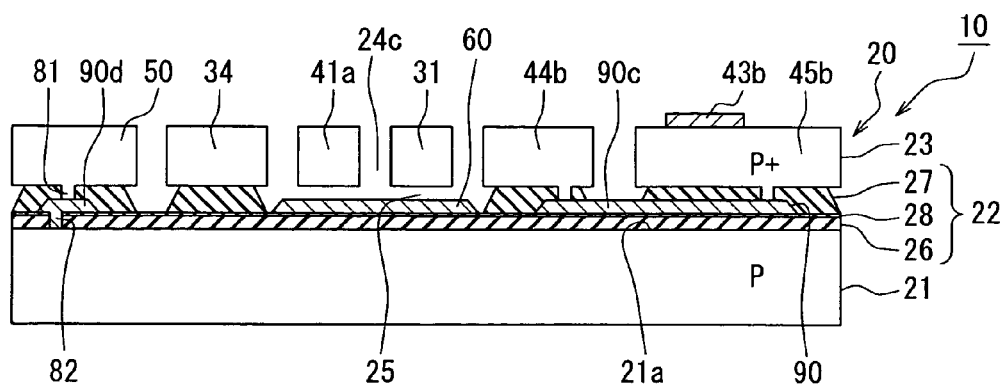
FIG. 26 is a diagram illustrating a cross-sectional view of a simplified model of the semiconductor dynamic quantity sensor according to the fourth embodiment.
Figure 27:
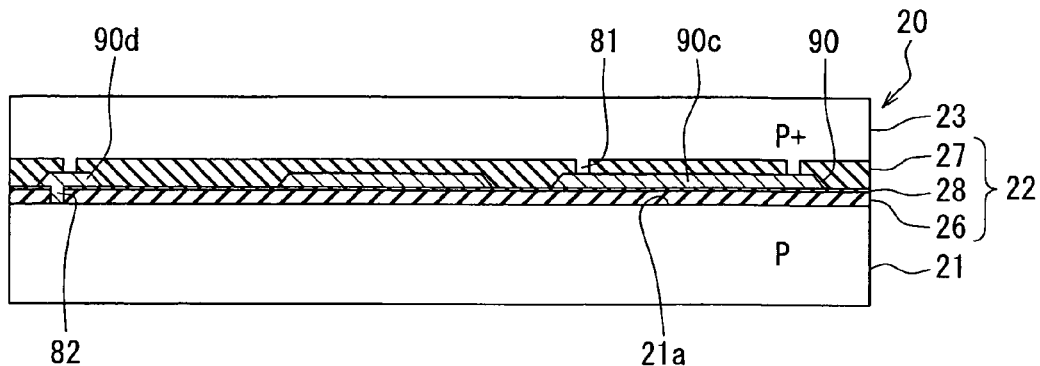
FIG. 27 is a diagram illustrating a method of manufacturing the semiconductor dynamic quantity sensor according to the fourth embodiment.
Figure 28:
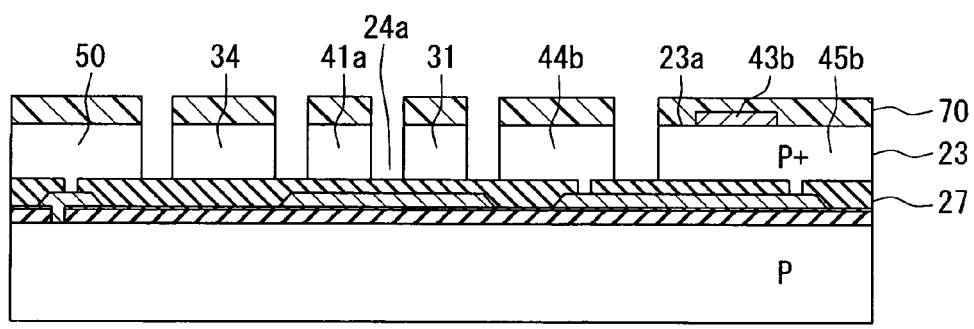
FIG. 28 is a diagram illustrating the method of manufacturing the semiconductor dynamic quantity sensor according to the fourth embodiment.
Figure 29:
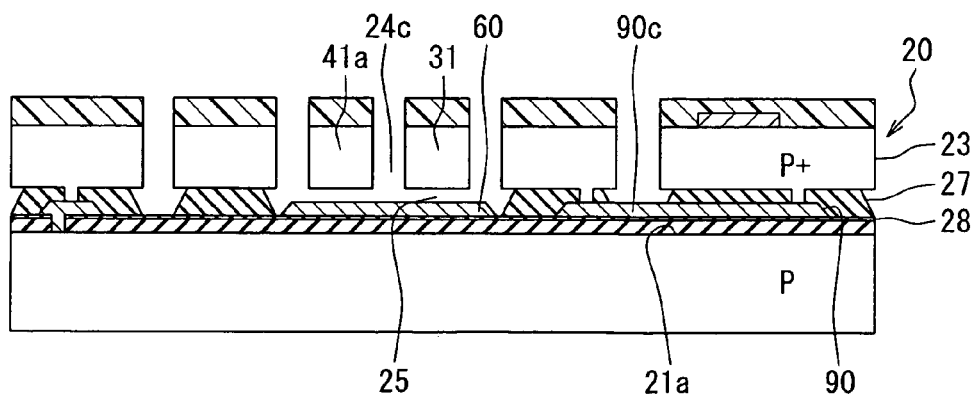
FIG. 29 is a diagram illustrating the method of manufacturing the semiconductor dynamic quantity sensor according to the fourth embodiment.

A semiconductor dynamic quantity sensor 10 according to a fourth embodiment of the present invention is described below with reference to FIGS. 23-29. FIG. 23 is a plan view of the semiconductor dynamic quantity sensor 10 according to the fourth embodiment. FIG. 24 is a cross-sectional view taken along the line XXIV-XXIV in FIG. 23. FIG. 25 is an enlarged view of FIG. 23. FIG. 26 is a cross-sectional view of a simplified model of the semiconductor dynamic quantity sensor 10 according to the fourth embodiment. FIGS. 27-29 are diagrams illustrating a method of manufacturing the simplified model of FIG. 26.

A difference of the fourth embodiment from the preceding embodiments is as follows.

As shown in FIGS. 23 and 24, the movable portion 30 is formed in the semiconductor layer 23 that is formed on the semiconductor substrate 21 through the insulation layer 22, and the lower wiring portion 90 is formed between the semiconductor substrate 21 and the semiconductor layer 23. The insulation layer 22 includes the first insulation layer 26 on the surface 21a of the semiconductor substrate 21 and the second insulation layer 27 on the first insulation layer 26. The lower wiring portion 90 is located between the first insulation layer 26 and the second insulation layer 27. In this way, the semiconductor dynamic quantity sensor 10 shown in FIGS. 23 and 24 has almost the same structure as the semiconductor dynamic quantity sensor 10 shown in FIGS. 9 and 10.

According to the fourth embodiment, the insulation layer 22 further includes a third insulation layer 28. The third insulation layer 28 is located between the first insulation layer 26 and the second insulation layer 27 and serves as an etching stopper in the etching of the second insulation layer 27. The lower wiring portion 90 is located on the third insulation layer 28. Further, the projection 60 made of the same conductive material as the lower wiring portion 90 is formed on the third insulation layer 28. Thus, the projection 60 and the lower wiring portion 90 are located in different positions on the same plane (i.e., the third insulation layer 28). As shown in FIG. 23, the projection 60 extends in the planar direction of the substrate 20 to cross the movable portion 30 and overlaps the movable portion 30 in the thickness direction of the substrate 20.

It is noted that the projection 60 extends in the planar direction of the substrate 20 to cross at least one beam of the movable portion 30 and overlaps the at least one beam in the thickness direction of the substrate 20. That is, the width of the projection 60 is greater than a short side width W1 of a corresponding beam located directly above the projection 60 so that the projection 60 can cross the corresponding beam in a short side direction of the corresponding beam.

The projection 60 can cross multiple beams that are parallel to each other and extend in the same direction. In an example shown in FIG. 25, one projection 60 extends in the long side direction of the weight 32 to collectively cross multiple beams of the movable electrode 31 and the spring 33 on each side of the weight 32. Further, the one projection 60 collectively crosses multiple beams of the fixed electrodes 41a, 41b.

A through hole (trench) 24c is formed in the substrate 20. The through hole (trench) 24c extends in the thickness direction of the substrate 20 and reaches the third insulation layer 28 by penetrating the semiconductor layer 23 and the second insulation layer 27. The semiconductor layer 23 is divided by the through hole (trench) 24c into multiple portions including the movable portion 30, the fixed portions 40a, 40b, and the peripheral portion 50. The second insulation layer 27 is removed between the movable portion 30 and the projection 60 in the thickness direction so that the space 25 can be formed between the movable portion 30 and the projection 60. The space 25 communicates with the through hole (trench) 24c.

As shown in FIGS. 23, 24, a planarization portion 90e can be formed along with the projection 60 and the lower wiring portion 90. The planarization portion 90e is used for planarization of the semiconductor layer 23 and is not used for electrical connection. Further, as shown in FIG. 23, a wire 46 can be formed on the surface 23a of the anchor 44b.

A method of manufacturing the semiconductor dynamic quantity sensor 10 shown in FIGS. 23-25 is described below with reference to FIGS. 27-29. For the sake of simplicity, the method of manufacturing the semiconductor dynamic quantity sensor 10 shown in FIGS. 23-25 is described based on the simplified model shown in FIG. 26.

Firstly, in a process shown in FIG. 27, the semiconductor substrate 20 is prepared. Specifically, a silicon oxide layer as the first insulation layer 26 is deposited to a thickness of about 0.5 μm to about 2 μm on the surface 21a of the semiconductor substrate 21 by thermal oxidation or the like. For example, the semiconductor substrate 21 can be of P-type and has a main surface that is a (100) plane. Then, a silicon nitride layer as the third insulation layer 28 is deposited to a thickness of about 0.05 μm to about 0.5 μm on the first insulation layer 26 by low pressure chemical vapor deposition (LPCVD), plasma CVD, or the like. Then, a through hole is formed in the first insulation layer 26 and the third insulation layer 28. Then, a highly-doped P-type (i.e., P+-type) polycrystalline silicon layer is deposited to a thickness of about 0.5 μm to about 2 μm on the third insulation layer 28 to fill the through hole in the first insulation layer 26 and the third insulation layer 28. Thus, a contact 82 is formed in the first insulation layer 26 and the third insulation layer 28. Then, the polycrystalline silicon layer on the third insulation layer 28 is patterned to form the projection 60, the lower wiring portion 90, and the planarization portion 90e.

As described above, according to the fourth embodiment, the projection 60 extends to cross the beam of the movable portion 30. Therefore, the width of the projection 60 can be minimized.

The shape of the projection 60 in cross section can depend on the etching for patterning the polycrystalline silicon layer. For example, when an anisotropic etching such as a RIE is used, the shape of the projection 60 in cross section can become rectangular. Further, when an isotropic etching such as a plasma etching or a wet etching is used, the shape of the projection 60 in cross section can become substantially trapezoidal or triangular. Furthermore, when an anisotropic etching and an isotropic etching are used in combination, the shape of the projection 60 in cross section can become substantially semicircular, for example.

Then, a silicon oxide layer as the second insulation layer 27 is deposited to a thickness of about 2 μm to about 5 μm on the third insulation layer 28 by CVD or the like, so that projection 60 and the lower wiring portion 90 can be covered with the second insulation layer 27. The thickness of the second insulation layer 27 defines the distance between the tip of the projection 60 and the movable portion 30 in the thickness direction of the substrate 20. Therefore, the distance between the tip of the projection 60 and the movable portion 30 can be adjusted by adjusting the thickness of the second insulation layer 27. Then, a through hole is formed in the second insulation layer 27. Then, a highly-doped P-type polycrystalline silicon layer is deposited to a thickness of about 5 μm to about 50 μm on the second insulation layer 27 to fill the through hole in the second insulation layer 27. Thus, the contact 81 is formed in the second insulation layer 27, and the semiconductor layer 23 is formed on the second insulation layer 27. Planarization of the semiconductor layer 23 can be performed as needed, for example, by chemical mechanical planarization (CMP).

Next, in a process shown in FIG. 28, the wiring portion including the pad 43b is formed on the surface 23a of the semiconductor layer 23. Then, an anisotropic etching (e.g., RIE) of the semiconductor layer 23 is performed by using the mask 70 to form the trench 24a in the semiconductor layer 23. The trench 24a extends in the thickness direction of the substrate 20 and reaches the second insulation layer 27, thereby dividing the semiconductor layer 23 into multiple portions including the movable portion 30, the fixed portions 40a, 40b, and the peripheral portion 50.

Then, in a process shown in FIG. 29, a selective etching of the second insulation layer 27 is performed through the trench 24a by using HF acid or vapor to remove the second insulation layer 27 located directly below the movable portion 30. In the selective etching of the second insulation layer 27, the lower wiring portion 90, the projection 60, and the third insulation layer 28 serve as an etching stopper. Thus, the second insulation layer 27 located directly below the movable portion 30 is removed so that the movable portion 30 can be movable. Further, the trench 24a is elongated to penetrate the second insulation layer 24 and changes to the through hole (trench) 24c that reaches the lower wiring portion 90, the projection 60, and the third insulation layer 28. Then, although not shown in the drawings, the mask 70 is removed, and a wafer dicing is performed. In this way, the simplified model shown in FIG. 26 is manufactured.

As described above, according to the fourth embodiment, the projection 60 and the lower wiring portion 90 are formed by patterning a uniform thickness conductive layer (i.e., polycrystalline silicon layer) that is formed on the surface 21a of the semiconductor substrate 21 through the first insulation layer 26. In such an approach, the projection 60 can be formed easily, even when the lower wiring portion 90 is included.

Further, according to the fourth embodiment, the projection 60 and the lower wiring portion 90 are located in different positions on the same plane in such a manner that the projection 60 crosses at least one beam of the movable portion 30. Therefore, the projection 60 can be located directly below the corresponding beam with accuracy of the order of micrometers. Accordingly, the projection 60 can be accurately positioned with respect to the movable portion 30 in the planar direction of the substrate 20. Since an expensive alignment machine is not needed, manufacturing cost can be reduced.

Further, according to the fourth embodiment, the second insulation layer 27 located directly below the movable portion 30 is removed so that the space 25 can be formed between the movable portion 30 and the tip of the projection 60. That is, the distance between the movable portion 30 and the tip of the projection 60 depends on the thickness of the second insulation layer 27. Therefore, a variation in the distance is prevented or reduced so that the projection 60 can be accurately positioned with respect to the movable portion 30 in the thickness direction of the substrate 20.

In summary, according to the fourth embodiment, although the lower wiring portion 90 is formed between the semiconductor substrate 21 and the semiconductor layer 23, the projection 60 can be accurately positioned with respect to the movable portion 30 at a reduced cost.

Further, according to the fourth embodiment, the projection 60 crosses the beam in the short side direction of the beam. Therefore, the projection 60 can be located directly below the beam; even if some misalignment occur in the short side direction and the long side direction. Thus, size reduction can be achieved. Alternatively, the projection 60 can cross the beam in the long side direction of the beam. However, in such a case, there is a need to increase the width of the beam to prevent misalignment in the short side direction. Therefore, it is preferable that the projection 60 cross the beam in the short side direction of the beam.

Figure 30:
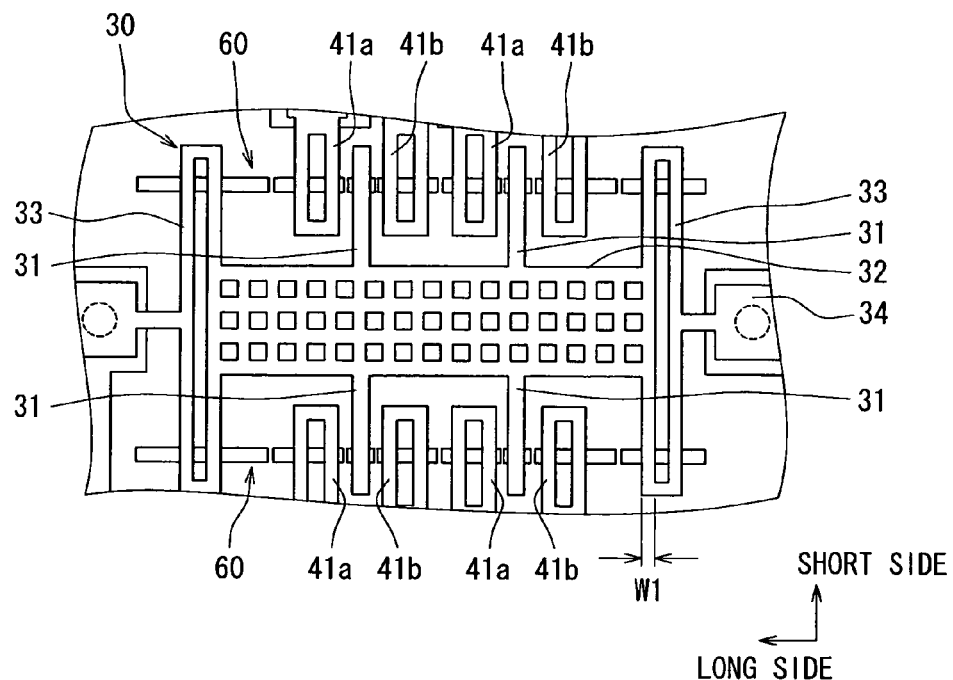
FIG. 30 is a diagram illustrating an enlarged plan view of a semiconductor dynamic quantity sensor according to a first modification of the fourth embodiment.

Further, according to the fourth embodiment, the projection 60 collectively crosses multiple beams that are parallel to each other and extend in the same direction. In such an approach, patterning of the polycrystalline silicon layer can be simplified. Alternatively, as shown in FIG. 30, the projection 60 (i.e., projection 60 directly below the movable portion 31) can only one beam of the movable portion 30.

Although not shown in the drawings, the projection 60 can be located directly below the weight 32 to cross at least one beam of the weight 32.

Further, according to the fourth embodiment, a silicon nitride layer as the third insulation layer 28 is formed on the entire first insulation layer 26. Alternatively, the third insulation layer 28 can have a slit or be separated into multiple portions in view of film stress.

Figure 31:
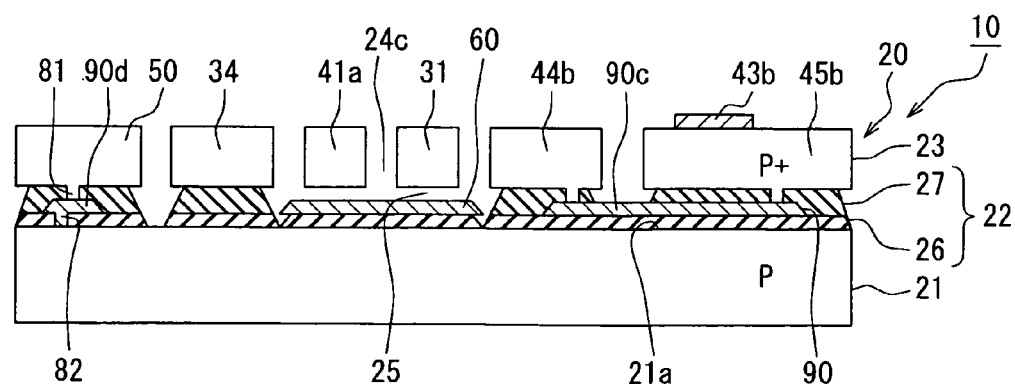
FIG. 31 is a diagram illustrating a cross-sectional view of a semiconductor dynamic quantity sensor according to a second modification of the fourth embodiment.

Further, according to the fourth embodiment, the insulation layer 22 includes the third insulation layer 28. Alternatively, as shown in FIG. 31, the insulation layer 22 can include only the first insulation layer 26 and the second insulation layer 27. In this case, the first insulation layer 26 is etched along with the second insulation layer 27 at a position where a patterned portion (e.g., lower wiring portion 90 or the projection 60) of the polycrystalline silicon layer is not located between the first insulation layer 26 and the second insulation layer 27.

Further, according to the fourth embodiment, each of the semiconductor substrate 21 and the semiconductor layer 23 is of P-type. Alternatively, each of the semiconductor substrate 21 and the semiconductor layer 23 can be of N-type. In this case, there is a need to form the contact region 52 (refer to FIG. 17) on the surface 23a side of the semiconductor layer 23. In a case where the semiconductor substrate 21 and the semiconductor layer 23 are not electrically connected together, one of the semiconductor substrate 21 and the semiconductor layer 23 can be of N-type, and the other of the semiconductor substrate 21 and the semiconductor layer 23 can be P-type.

Further, according to the fourth embodiment, the projection 60 and the lower wiring portion 90 are formed by patterning a highly-doped P-type (i.e., P+-type) polycrystalline silicon layer. If the semiconductor layer 23 is of N-type, the projection 60 and the lower wiring portion 90 can be formed by patterning a highly-doped N-type (i.e., N+-type) polycrystalline silicon layer. It is noted that the projection 60 and the lower wiring portion 90 can be formed by patterning a conductive layer such as a metal layer.

Figure 32:
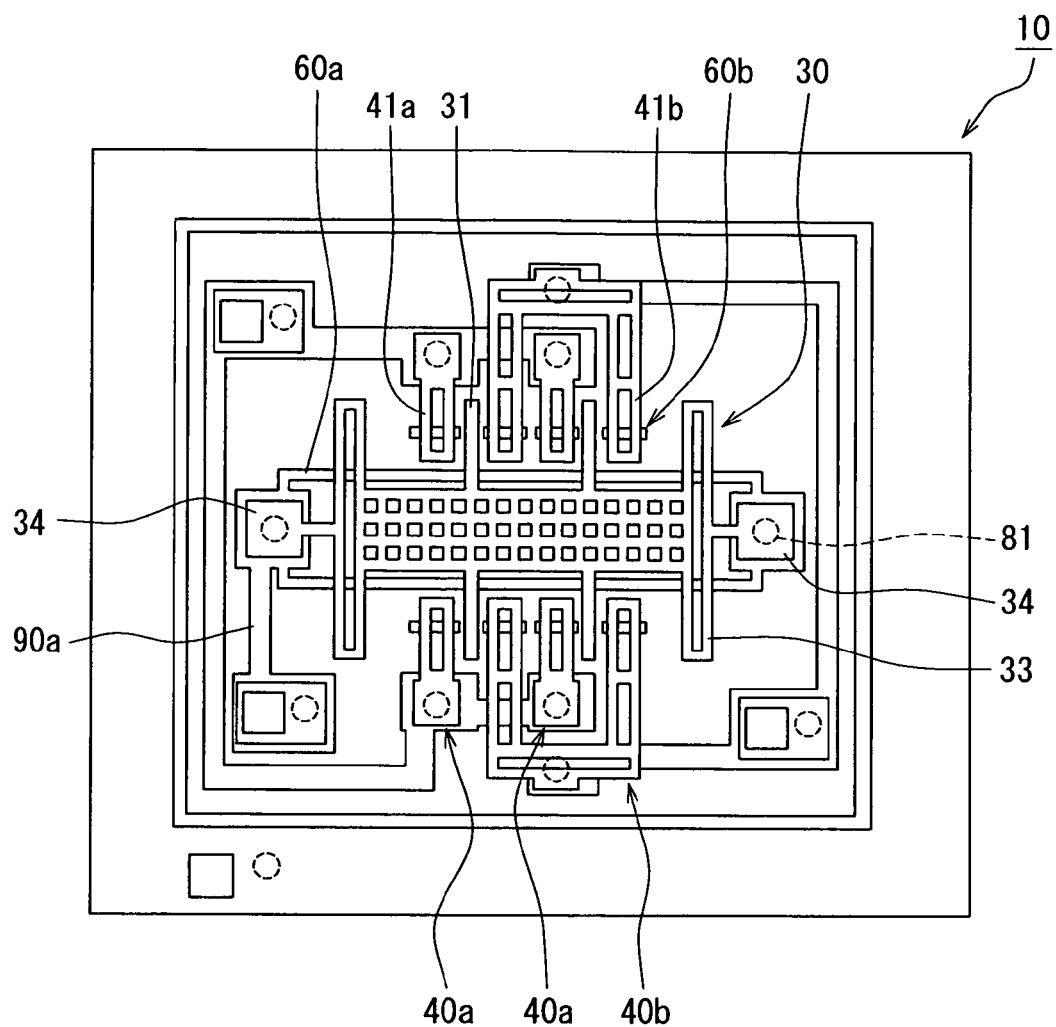
FIG. 32 is a diagram illustrating a plan view of a semiconductor dynamic quantity sensor according to a third modification of the fourth embodiment.

Further, according to the fourth embodiment, the projection 60 has a floating potential. Alternatively, as shown in FIG. 32, a projection 60a can be electrically connected to the movable portion 30. In such an approach, the movable portion 30 and the projection 60a become the same potential. Therefore, there arises no electrostatic force due to a potential difference between the movable portion 30 and the projection 60a so that a sticking between the movable portion 30 and the projection 60a can be prevented.

Specifically, in a modification shown in FIG. 32, the projection 60a is located directly below only the movable portion 30, and a projection 60b is located directly below only the fixed electrodes 41a, 41b of the fixed portions 40a, 40b. The projections 60a, 60b are electrically insulated from each other. An end of the projection 60a is integrally joined to an end of the lower wiring portion 90a. It is noted that the beam of the fixed electrodes 41a, 41b is lighter in weight than that of the movable portion 30. Therefore, it is less like that the fixed electrodes 41a, 41b are deformed in the thickness direction of the substrate 20. For this reason, the projection 60b located directly below the fixed electrodes 41a, 41b can be removed.

Modifications

The embodiments described above can be modified in various ways.

Figure 33:
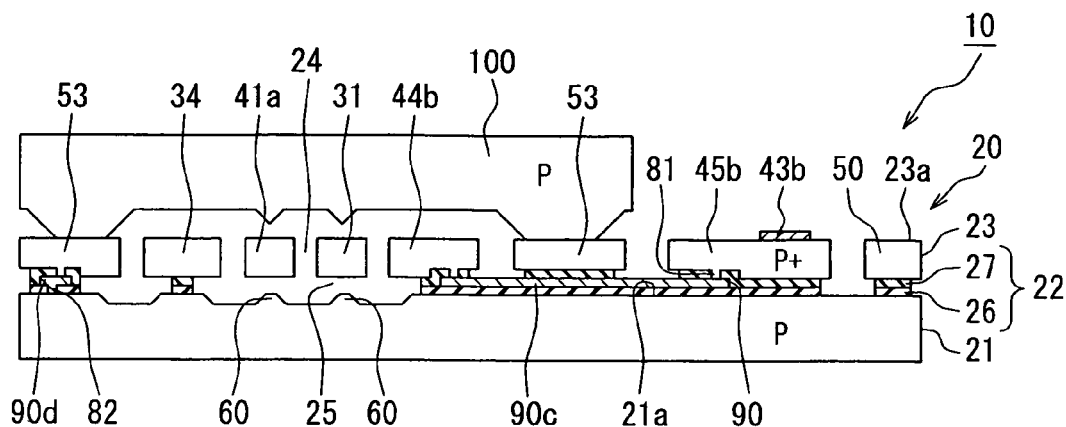
FIG. 33 is a diagram illustrating a cross-sectional view of a semiconductor dynamic quantity sensor according to a modification of the present invention.

For example, as shown in FIG. 33, the movable portion 30 can be sealed by a cap 100 that is fixed directly or through a low-melting-point glass to the surface 23a of the semiconductor layer 23. In FIG. 33, the cap 100 is directly bonded to the semiconductor layer 23 at a normal temperature of a room temperature to about 200° C. The cap 100 and the semiconductor layer 23 are bonded at a bonding region 53 that surrounds the movable portion 30 and the fixed electrodes 41a, 41b. Thus, a sensing portion including the movable portion 30 is located in a hermetically sealed space. The hermetically sealed space can be filled with a predetermined gas of a predetermined pressure depending on the intended use. For example, when the semiconductor dynamic quantity sensor 10 is configured as an angular velocity sensor, it is preferable that the hermetically sealed space be under vacuum. For example, when the semiconductor dynamic quantity sensor 10 is configured as an acceleration sensor, it is preferable that the hermetically sealed space be filled with nitrogen gas or atmospheric gas of one to several atmospheres.

In the modification shown: in FIG. 33, the contact 81 and the pad 43b are located in different positions in the planar direction of the substrate 20. Therefore, it is less likely that wire bonding stress is applied to the contact 81. Accordingly, reliability of the contact 81 is improved. The same advantage can be obtained by locating other pads (e.g., pad 51) in a different position from the contact 81 or the contact 82.

Further, the cap 100, the bonding region 53, and the semiconductor substrate 21 can be fixed to a predetermined potential (e.g., ground potential) by forming a pad on the surface 23a of the bonding region 53 of the semiconductor layer 23. In such an approach, an electromagnetic shield for the sensing portion can be provided.

Figure 34:
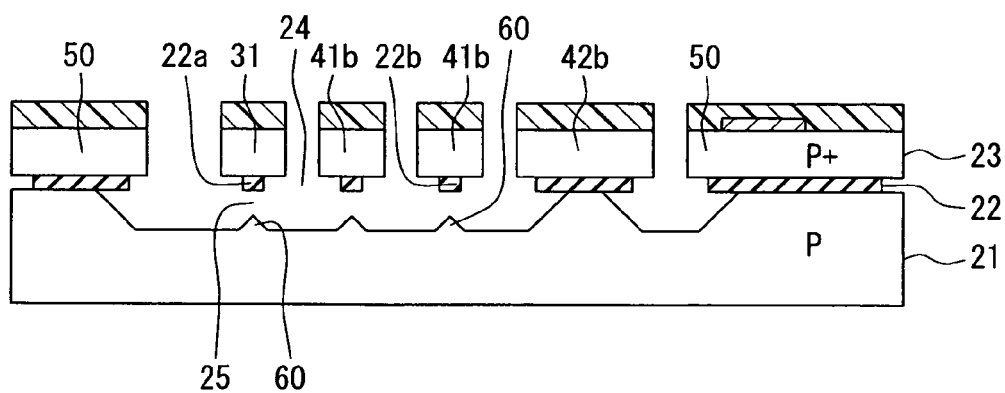
FIG. 34 is a diagram illustrating a cross-sectional view of a semiconductor dynamic quantity sensor according to another modification of the present invention.

In the first and third embodiments, after a selective etching of the insulation layer 22 is performed through the trench 24a, a selective anisotropic etching of the semiconductor substrate 21 is performed using an alkaline etching solution to form the projection 60 on the surface 21a of the semiconductor substrate 21 in such a manner that the tip of the projection 60 is in contact with the semiconductor layer 22a. Alternatively, as shown in FIG. 34, the semiconductor substrate 21 can be overetched in the anisotropic etching so that the tip of the projection 60 can be separated from the insulation layer 22a. In such an approach, the movable portion 30 is released from the semiconductor substrate 21 so that the movable portion 30 can be movable. Therefore, there is no need to perform an additional process for removing the insulation layer 22a directly below the movable portion 30. In this case, the movable portion 30 is released from the semiconductor substrate 21 under a condition that the insulation layer 22a in contact with the movable portion 30 is left.

Such changes and modifications are to be understood as being within the scope of the present invention as defined by the appended claims.

What is claimed is:

1. A semiconductor dynamic quantity sensor comprising:
a substrate having a thickness direction and a planar direction perpendicular to the thickness direction, the substrate comprising:
   a monocrystalline silicon semiconductor substrate having a main surface, the main surface including a recess and a projection adjacent to the recess, the projection being trapezoidal or triangular in cross section;
   an insulation layer on a main surface of the semiconductor substrate and defining a first through hole extending in the thickness direction and communicating the recess of the semiconductor substrate, and
   a P-type silicon semiconductor layer on a surface of the insulation layer, the semiconductor layer defining a second through hole extending in the thickness direction, the second through hole communicating with the first through hole and dividing the semiconductor layer into a movable portion that is configured to move upon application of a dynamic quantity, wherein
the main surface of the semiconductor substrate is different from a (111) plane,
an impurity concentration of the P-type semiconductor layer is greater than an impurity concentration of the semiconductor substrate,
a tip of the projection of the semiconductor substrate is located directly below the movable portion and spaced from the movable portion by a predetermined distance in the thickness direction,
a width of the tip of the projection is less than a width of the movable portion in the planar direction, and
the distance between the tip of the projection and the movable portion is equal to a thickness of the insulation layer.

2. A semiconductor dynamic quantity sensor comprising:
a substrate having a thickness direction and a planar direction perpendicular to the thickness direction, the substrate comprising:
   a monocrystalline silicon semiconductor substrate having a main surface, the main surface including a recess and a projection adjacent to the recess, the projection being trapezoidal or triangular in cross section;
   an insulation layer on a main surface of the semiconductor substrate and defining a first through hole extending in the thickness direction and communicating with the recess of the semiconductor substrate, and
   an N-type silicon semiconductor layer on a surface of the insulation layer, the semiconductor layer defining a second through hole extending in the thickness direction, the second through hole communicating with the first through hole and dividing the semiconductor layer into a movable portion that is configured to move upon application of a dynamic quantity, wherein
the main surface of the semiconductor substrate is different from a (111) plane,
a tip of the projection of the semiconductor substrate is located directly below the movable portion and spaced from the movable portion by a predetermined distance in the thickness direction,
a width of the tip of the projection is less than a width of the movable portion in the planar direction, and
the distance between the tip of the projection and the movable portion is equal to a thickness of the insulation layer.

3. A semiconductor dynamic quantity sensor comprising:
a semiconductor substrate having a thickness direction and a planar direction perpendicular to the thickness direction;
a first insulation layer on a surface of the semiconductor substrate;
a lower wiring portion on the first insulation layer and made of an electrically conductive material;
a projection on the first insulation layer and made of the same conductive material as the lower wiring portion;
a second insulation layer on the lower wiring portion;
a semiconductor layer on the second insulation layer, the semiconductor layer defining a through hole extending in the thickness direction, the through hole dividing the semiconductor layer into a movable portion having a beam structure including a beam, the movable portion being configured to move upon application of a dynamic quantity, wherein
the projection extends in the planar direction of the semiconductor substrate to cross the beam of the movable portion and is separated from the movable portion in the thickness direction of the semiconductor substrate to form a space therebetween, and
the space communicates with the through hole.

4. The semiconductor dynamic quantity sensor according to claim 3, wherein
the projection crosses the beam of the movable portion in a short side direction of the beam.

5. The semiconductor dynamic quantity sensor according to claim 4, wherein
the movable portion includes at least two parallel beams, and
the projection collectively crosses the parallel beams in the short side direction.

6. The semiconductor dynamic quantity sensor according to claim 5, wherein
the projection is electrically connected to the movable portion.

7. The semiconductor dynamic quantity sensor according to claim 3, further comprising:
a third insulation layer located between the first insulation layer and the second insulation layer and serving as a stopper in an etching of the second insulation layer, wherein
the lower wiring portion and the projection are located on the third insulation layer.

8. The semiconductor dynamic quantity sensor according to claim 1, wherein the main surface of the semiconductor substrate is a (100) plane.

9. The semiconductor dynamic quantity sensor according to claim 1, wherein the main surface of the semiconductor substrate is a (110) plane.

10. The semiconductor dynamic quantity sensor according to claim 1, wherein the movable portion has a bottom surface located facing the tip of the projection, and the bottom surface of the movable portion is flat.

11. The semiconductor dynamic quantity sensor according to claim 2, wherein the main surface of the semiconductor substrate is a (100) plane.

12. The semiconductor dynamic quantity sensor according to claim 2, wherein the main surface of the semiconductor substrate is a (110) plane.

13. The semiconductor dynamic quantity sensor according to claim 2, wherein the movable portion has a bottom surface located facing the tip of the projection, and the bottom surface of the movable portion is flat.

* * * * *